(12) United States Patent
Yamamoto et al.

(10) Patent No.: US 7,986,256 B2
(45) Date of Patent: Jul. 26, 2011

(54) A/D CONVERTER

(75) Inventors: Michiyo Yamamoto, Osaka (JP); Kenji Murata, Osaka (JP); Masakazu Shigemori, Osaka (JP)

(73) Assignee: Panasonic Corporation, Osaka (JP)

( * ) Notice: Subject to any disclaimer, the term of this patent is extended or adjusted under 35 U.S.C. 154(b) by 24 days.

(21) Appl. No.: 12/377,989

(22) PCT Filed: Aug. 10, 2007

(86) PCT No.: PCT/JP2007/065697
§ 371 (c)(1),
(2), (4) Date: Feb. 18, 2009

(87) PCT Pub. No.: WO2008/020567
PCT Pub. Date: Feb. 21, 2008

(65) Prior Publication Data
US 2010/0013692 A1    Jan. 21, 2010

(30) Foreign Application Priority Data
Aug. 18, 2006 (JP) ................................ 2006-223665

(51) Int. Cl.
H03M 1/12 (2006.01)
(52) U.S. Cl. ................. 341/155; 341/158; 341/159
(58) Field of Classification Search ................. 341/158
See application file for complete search history.

(56) References Cited

U.S. PATENT DOCUMENTS

| | | | |
|---|---|---|---|
| 7,158,069 B2 * | 1/2007 | Confalonieri et al. | 341/155 |
| 7,212,143 B1 * | 5/2007 | Confalonieri et al. | 341/155 |
| 2003/0048213 A1 | 3/2003 | Sushihara et al. | |
| 2005/0231412 A1 | 10/2005 | Confalonieri et al. | |
| 2006/0145683 A1 | 7/2006 | Shigeta et al. | |

FOREIGN PATENT DOCUMENTS

| | | |
|---|---|---|
| JP | 1-241222 | 9/1989 |
| JP | 5-259913 | 10/1993 |
| JP | 9-261051 | 10/1997 |
| JP | 2002-94495 | 3/2002 |
| JP | 2003-158456 | 5/2003 |
| JP | 2005-201709 | 7/2005 |

OTHER PUBLICATIONS

International Search Report issued Sep. 25, 2007 in the International (PCT) Application No. PCT/JP2007/065697.
Written Opinion of the ISA issued Sep. 25, 2007 in the International (PCT) Application No. PCT/JP2007/065697.
Written Opinion of the IPEA issued Nov. 18, 2008 in the International (PCT) Application No. PCT/JP2007/065697.
International Preliminary Report on Patentability issued Feb. 13, 2009 in the International (PCT) Application No. PCT/JP2007/065697.
Texas Instruments Incorporated, "8-Bit, 8-Channel Sampling Analog-To-Digital Converter with I²C™ Interface", ADS7830 Datasheet, SBAS302—Dec. 2003, Texas Instruments Incorporated, pp. 1-13.

* cited by examiner

*Primary Examiner* — Khai M Nguyen
(74) *Attorney, Agent, or Firm* — Wenderoth, Lind & Ponack, L.L.P.

(57) ABSTRACT

An external input operation clock signal is required for operating a conventional A/D converter, and the performance of the A/D converter is undesirably determined by the characteristics of the external input operation clock. A clock generator circuit for automatically generating an operation clock is provided inside an A/D converter to make the A/D converter require no external input operation clock. Further, a circuit for detecting the operation times of the constituents of the A/D converter is provided to generate a clock with which the A/D converter is optimally operated, thereby realizing high-speed operation and low power consumption.

15 Claims, 19 Drawing Sheets

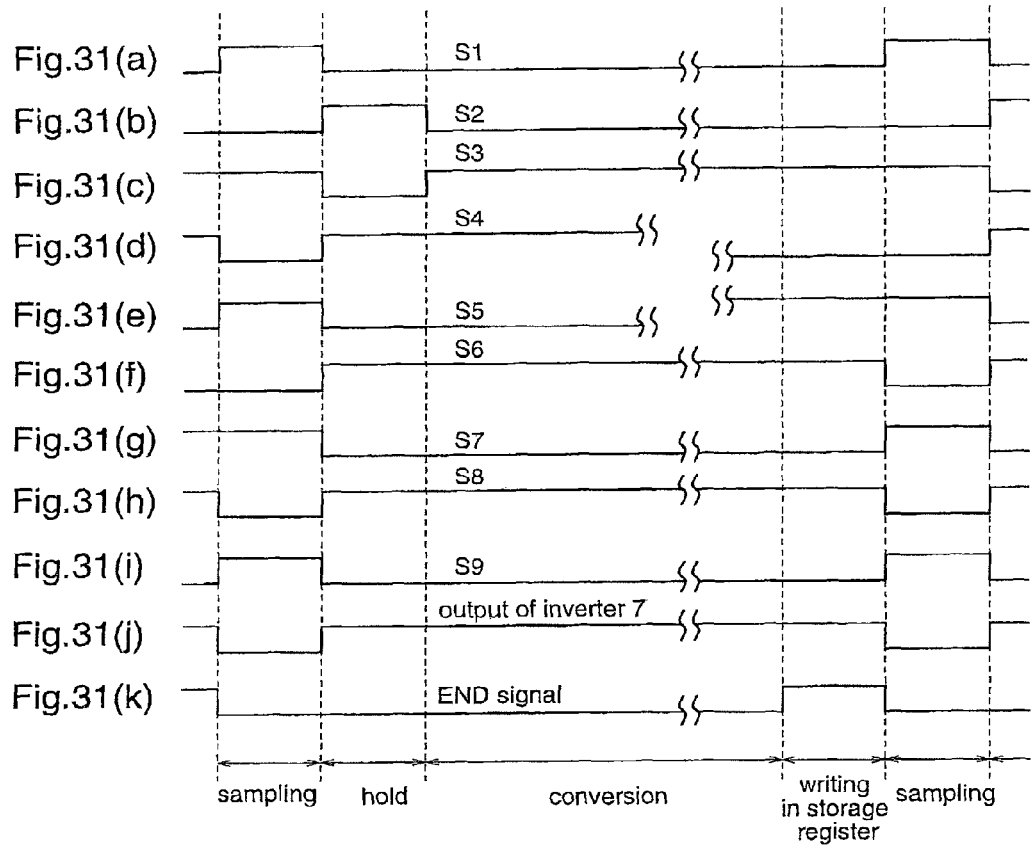
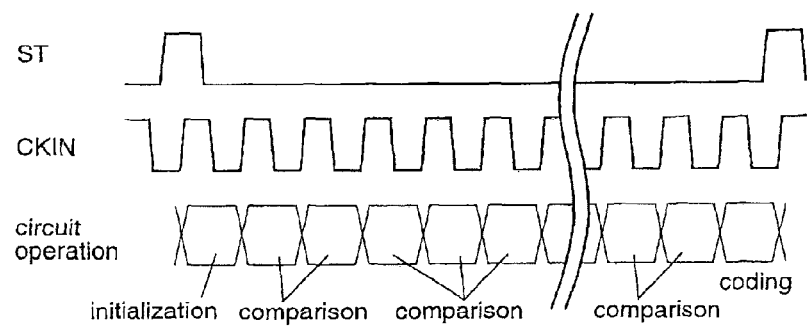
Fig.32

A/D CONVERTER

TECHNICAL FIELD

The present invention relates to an improved A/D converter for converting an analog signal into a digital signal.

BACKGROUND ART

Hereinafter, a conventional parallel type A/D converter will be described.

FIG. 24 is a diagram illustrating a conventional parallel type A/D converter 1200.

With reference to FIG. 24, the parallel type A/D converter 1200 has, as external inputs, an analog input signal AIN, an external input operation clock signal CKIN, and a start signal ST, and it comprises a reference voltage generation circuit 1201, a comparison circuit 1202, a logic circuit 1203, and a clock buffer circuit 1204.

The clock buffer circuit 1204 includes a plurality of inverters connected in series with each other, receives the external input operation clock signal CKIN, and generates an operation clock signal CLK_CMP for the comparison circuit and an operation clock signal CLK_ENC for the logic circuit by so-called inverter delay, i.e., by successively delaying the external input operation clock signal CKIN which is input to the first stages of the plural inverters connected in series with each other by these inverters.

Accordingly, the external input operation clock signal CKIN, the comparison circuit operation clock signal CLK_CMP, and the logic circuit operation clock signal CLK_ENC have completely the same signal elements such as frequency, amplitude, duty, jitter and the like.

However, the phase of the logic circuit operation clock signal CLK_ENC and the phase of the comparison circuit operation clock signal CLK_CMP are inverted from each other.

The operation of the conventional parallel type A/D converter is described in Embodiment 1 of Patent Document 1.

FIG. 25 is a diagram illustrating the configuration of an A/D converter 1200 according to Embodiment 1 of Patent Document 1.

As shown in FIG. 25, the A/D converter 1200 includes a reference voltage generation circuit (reference voltage generation means) 1201, a differential amplifier line (differential amplification means) 112, and an operation circuit (operation means, comparison circuit) 1202.

This A/D converter 1200 may further include an encoding circuit (coding means, logic circuit) 1203.

The reference voltage generation circuit 1201 generates a plurality of reference voltages VR1 to VRm+1 by a plurality of resistors R1 to Rm (m: an integer not less than 2) for voltage division which are connected in series with each other. The reference voltage VRm+1 is obtained from a tap which is connected to a high voltage (power supply voltage) applying node 1201a and to a resistor Rm, the reference voltage VRi (i=2, ..., m) is obtained from a tap which is connected between a resistor Ri−1 and a resistor Ri, and a reference voltage VR1 is obtained from a tap which is connected to a low voltage (ground voltage) applying node 1201b and to a resistor R1.

The differential amplifier line 112 includes m+1 pieces of differential amplifiers A1 to Am+1, and amplifies voltage differences between the respective reference voltages VR1 to VRm+1 and an input analog signal voltage Ain supplied from an analog signal voltage input terminal 104 to generate a plurality of output voltage sets.

Each of the plural output voltage sets includes a complementary noninverted output voltage and an inverted output voltage.

The noninverted output voltages and the inverted output voltages which are included in the output voltage sets supplied from the differential amplifiers A1 to Am+1 are directly outputted to comparison circuits Cr1 to Crn+1 in the operation circuit (comparison circuit) 1202.

The operation circuit (comparison circuit) 1202 includes n+1 pieces of comparison circuits (comparison means) Cr1 to Crn+1, and each of the comparison circuits Cr1 to Crn+1 has four inputs. The comparison circuits Cr1 to Cr4 receive the noninverted output voltages and the inverted output voltages from the differential amplifiers A1 and A2, the comparison circuits Cr5 to Cr8 receive the noninverted output voltages and the inverted output voltages from the differential amplifiers A3 and A4, ..., and the comparison circuits Crn−2 to Crn+1 receive the noninverted output voltages and the inverted output voltages from the differential amplifiers Am and Am+1. That is, every four comparison circuits receive the noninverted output voltages and the inverted output voltages from two differential amplifiers placed at both ends thereof. The operation circuit (comparison circuit) 1202 receives the plural output voltage sets, and operates according to a clock signal.

Each of the comparison circuits Cr1 to Crn+1 has an input transistor part and a positive feedback part. The first output voltage set and the second output voltage set among the plural output voltage sets are input to the input transistor part. The positive feedback part is operated according to the clock signal.

Then encoding circuit 1203 encodes the comparison result (digital signal) to generate a digital data signal.

In this way, in the conventional parallel type A/D converter 1200, the reference voltage generation circuit 1201 comprises a plurality of resistors connected in series with each other as described above, and the higher voltage side reference voltage is connected to an end of the series-connected body while the lower voltage side reference voltage is connected to the other end thereof.

Then, the divided voltages of the reference voltages are outputted as the reference voltages from the plural connection nodes between the resistors.

In the differential amplifier line 112, each of the plural differential amplifiers has two input terminals, and the input analog signal voltage is input to one of the input terminals while one of the reference voltages is input to the other input terminal, and the differential amplifier outputs a noninverted output voltage and an inverted output voltage.

In the comparison circuit 1202, the input transistor part performs a predetermined weighted operation to the noninverted output voltage and the inverted output voltage from the differential amplifier to determine a threshold voltage, and outputs, to the positive feedback part, a comparison result obtained by comparing a difference between the first noninverted output voltage and the first inverted output voltage with a difference between the second noninverted output voltage and the second inverted output voltage.

The positive feedback part amplifies the comparison result outputted from the input transistor part when the clock signal is at a predetermined level, and outputs the amplified comparison result as a digital signal to the encoding circuit. This digital signal is, for example, a H-level or L-level digital signal according to the comparison result.

As described above, in the conventional parallel type A/D converter 1200 shown in FIG. 24, the external input operation clock signal is delayed and inverted by the clock buffer 1204 to generate the comparison circuit operation clock signal CLK_CMP and the logic circuit operation clock signal CLK_ENC.

Therefore, as shown in FIG. 26, when a clock having a duty ratio of 50% is used as the external input operation clock signal CKIN, the generated comparison period of the comparison circuit 1202 becomes equal to the initialization period of the logic circuit 1203.

Likewise, the initialization period of the comparison circuit 1202 becomes equal to the coding period of the logic circuit 1203, and thus A/D conversion is carried out.

As described above, in the conventional parallel type A/D converter, the comparison circuit operation clock signal CLK_CMP and the logic circuit operation clock signal CLK_ENC are generated by simply distributing the external input operation clock signal CKIN.

Therefore, the performances of the A/D converter such as maximum operation frequency and power consumption are undesirably determined by the characteristics of the external input operation clock signal CKIN such as duty, frequency, and jitter.

Further, since it is indispensable to supply the external input operation clock signal CKIN during the operation, a clock generator for supplying this clock signal takes cost and space.

Next, FIG. 27 is a diagram illustrating a conventional successive-approximation type A/D converter 1300.

In FIG. 27, the successive-approximation type A/D converter 1300 has, as external inputs, an analog input signal AIN, an external input operation clock signal CKIN, and a start signal ST, and comprises a reference voltage generation circuit 1301, a comparison circuit 1302, and a logic circuit 1303.

The operation of the conventional successive-approximation type A/D converter 1300 is described in Embodiment 1 of Patent Document 2.

FIG. 28 is a diagram illustrating the configuration of the A/D converter 1300 according to Embodiment 1 of Patent Document 2.

As shown in FIG. 28, the A/D converter 1300 has an analog input terminal 51 and an analog reference power supply terminal 52, and it is configured comprising a controller 1, inverters 1 to 6, 8, and 17 to 21, NAND circuits 7 and 9 to 16, transfer gates 22 to 32, capacitors 33 to 36 configuring a capacitor array, a comparator 1302, and a storage register 38.

Further, the reference voltage generation circuit 1301 in the A/D converter 1300 is configured comprising transfer gates 22 to 32, capacitors 33 to 36, and an inverter 21.

The transfer gates 24, 26, 28, 30 and the capacitors 33, 34, 35, 36 are connected in series with each other, and are connected between the ground and the noninverted input of the comparison circuit 1302. The noninverted input of the comparison circuit 1302 is grounded via the transfer gate 32.

Further, one ends of the transfer gates 25, 27, 29, 31 are connected to the connection nodes of the transfer gates 24, 26, 28, 30 and the capacitors 33, 34, 35, 36 while the other ends thereof are connected to each other and to the analog reference power supply terminal 52 and the analog input terminal 51 via the transfer gates 22 and 23.

Further, the successive-approximation logic circuit 1303 in the A/D converter 1300 is configured comprising a controller 1, inverters 2 to 6, 8, 17 to 20, and NAND circuits 7 and 9 to 16.

END of the controller 1 is connected to one inputs of the NAND circuits 7 and 9 to 16 via the inverter 6. The control signals S1, S2, S5, S7, and S9 of the controller 1 are connected to the other inputs of the NAND circuits 7, 9, 12, 14, and 16, and the control signals S3, S4, S6, and S8 of the controller 1 are connected to the other inputs of the NAND circuits 10, 11, 13, and 15 via the inverters 2, 3, 4, and 5, respectively.

The output of the NAND circuit 7 is connected to the control inputs of the transfer gates 23 and 32 via the inverter 8, and the output of the inverter 8 is connected to the control input of the transfer gate 22 via the inverter 21. Further, the outputs of the NAND circuits 10, 11, 13 and 15 are connected to the control inputs of the transfer gates 25, 26, 28, and 30, and the outputs of the NAND circuits 9, 12, 14, and 16 are connected to the control inputs of the transfer gates 24, 27, 29, and 31 via the inverters 17, 18, 19, and 20, respectively.

The relative capacitance ratios of the capacitors 33(capacitance C1), 34(capacitance C2), 35(capacitance C3), and 36(capacitance C4) are set as shown in the following formula:

$$C1:C2:C3:C4=1:1/2:1/4:1/4 \quad (1)$$

Further, FIGS. 29(a),(b),(c),(d),(e),(f),(g),(h),(i),(j), and (k) are timing charts showing the operation signals used in Embodiment 1 of Patent Document 2.

Next, the operation of Embodiment 1 of Patent Document 2 will be described with reference to the block diagram shown in FIG. 28 and the timing charts shown in FIGS. (a),(b),(c), (d), (e),(f),(g),(h),(i),(j), and (k).

As for the timings of the control signals S1 to S9 and the END signal which are outputted from the controller 1, the timings are similar to those described in Prior Art (refer to FIG. 31) of Patent Document 2.

Initially, during a sample period T1 (refer to FIG. 31), the output levels of the control signals S1, S3, S5, S7 and S9 outputted from the controller 1 are "HIGH", and the transfer gates 67, 69, 71, 73 and 75 are in their ON states.

Further, the output levels of the control signals S2, S4, S6 and S8 outputted from the controller 1 and the output level of the inverter 77 are "LOW", and the transfer gates 66, 68, 70, 72 and 74 are in their OFF states, and thereby the analog signal inputted through the analog input terminal 55 is transferred through the transfer gates 75, 67, 69, 71 and 73 to the capacitors 78, 79, 80 and 81, and thus charging and discharging of the capacitors are carried out.

Thereby, sampling of the analog values of the analog signal is carried out.

During a hold period T2 that follows the above-described sampling period, the output levels of the control signals S1, S3, S5, S7 and S9 outputted from the controller 1 are "LOW", and the transfer gates 67, 69, 71, 73 and 75 are in their OFF states, and the electric charges which were taken in during the sampling period T1 are held by the capacitors 78, 79, 80 and 81.

The voltage V of the compare line which is input to the comparator 37 at this time is represented by the following formula, with the level of the analog voltage inputted to the analog input terminal 55 being Vi.

$$V=-Vi \quad (2)$$

Next, the A/D conversion operation takes place. Initially, in the first state of the conversion operation, the output level of the control signal S3 becomes "HIGH" in the controller 1 and thereby the transfer gate 67 is turned on. Thereby, the level of the reference voltage Vr which is supplied from the analog reference power supply terminal 56 is applied to one terminal of the capacitor 78.

Since the capacitance C1 of the capacitor 78 is ½ of the total capacitance value of the capacitors C1 to C4, the voltage V of the compare line inputted to the comparator 37 is given by the following formula:

$$V = -Vi + Vr/2 \qquad (3)$$

In this formula (3), when V<0, the output level of the comparator 37 which is transferred to the controller 1 becomes "0", and the output level of the control signal S3 which is outputted from the controller 1 is maintained at "HIGH", and thereby the transfer gate 67 remains in its ON state, and the most significant bit is set to "1".

On the other hand, when V>0, the output level of the comparator 37 becomes "HIGH", and the output level of the control signal S2 outputted from the controller 1 becomes "HIGH" while the output level of the control signal S3 becomes "LOW", and thereby the transfer gate 66 is turned on while the transfer gate 67 is turned off, and thus the most significant bit is set to "0".

Thereby, in FIG. 31, "HIGH" is set at the most significant bit in the state where the output level of S2 is "LOW" and the output level of S3 is "HIGH".

Next, the 2nd bit from the most significant bit is determined. In the controller 1, the output level of the control signal S5 is set to "HIGH" to turn on the transfer gate 69, and thereby the voltage V of the compare line inputted to the comparator 37 becomes a voltage which is represented by one of the following two formulae according to the state of the already-set most significant bit.

$$V = -Vi + Vr/2 + Vr/4 \text{ (when the most significant bit is "HIGH")} \qquad (4)$$

$$V = -Vi + Vr/4 \text{ (when the most significant bit is "LOW")} \qquad (5)$$

In the example shown in the timing chart of FIG. 31, since the most significant bit is set at "HIGH", the voltage V of the compare line is represented as follows:

$$V = -Vi + Vr + Vr/4 \qquad (6)$$

Also in this case, as in the case of determining the most significant bit, the 2nd bit from the most significant bit is set to "HIGH" by the comparator 37 and the controller 1 when V<0, and it is set to "0" when V>0. When the bits up to the least significant bit are determined in similar procedure, the voltage of the compare line is sorted to any of eight states from (1111) to (0000). In the timing chart of FIG. 31, it is finally (1100).

Next, in the state where the A/D conversion has been completed as described above and the conversion result is written in the storage register 38, the level of the END signal outputted from the controller 1 changes from "LOW" to "HIGH" in the successive-approximation type A/D converter 1300 of Embodiment 1 of Patent Document 2.

The A/D conversion result is written in the storage register 38 by the control function due to this END signal, and the output level of the inverter 6 changes from "HIGH" to "LOW", and thereby all the output levels of the NAND circuits 7 and 9 to 16 become "HIGH".

Thereby, all the gates of the transfer gates 22, 25, 26, 28 and 30 are turned on while all the gates of the transfer gates 23, 24, 27, 29, 31 and 32 are turned off by the inversion functions of the inverters 8 and 17 to 21.

In this case, the total charge capacitance Q in the capacitors 33 to 36 is initialized as represented by the following formula:

$$Q = C1 \cdot Vr \qquad (7)$$

Accordingly, in the sampling state of the next A/D conversion which is subsequently performed, all the gates of the transfer gates 22, 24, 26, 28 and 30 are turned off.

Further, the respective gates of the transfer gates 23, 25, 27, 29, 31 and 32 are all turned on, and the voltage level Vo in the B line at starting the sampling is represented by the following formula:

$$Vo = Vr \cdot C1/(C1+C2+C3+C4) = Vr/2 \qquad (8)$$

Accordingly, during the sampling of the analog voltage values applied to the analog input terminal 101 which are held by the capacitors 33 to 36, since charging or discharging is always performed from the level of Vr/2 regardless of the charge capacitance that is sampled/held in the previous conversion, constant A/D conversion characteristics are obtained for the analog input voltage of the constant level.

Further, the maximum charge amount to be charged or discharged for the capacitors 33 to 36 is within the range from maximum 0 to Vr level in the conventional case, it is within the range from 0 to Vr/2 or from Vr/2 to Vr in Embodiment 1 of Patent Document 2, and therefore, the charge amount is reduced to ½.

Accordingly, when the sampling period is equal to that of the conventional example, it is possible to double the allowable value for the resistance value connected to the analog input terminal 101. Further, when the resistance value connected to the analog input terminal is equal to that of the conventional example, the length of the sampling period can be reduced to ½.

That is, the reference voltage generation circuit 1301 has a plurality of capacitors which are connected in parallel with each other and have the capacitance ratios set at 1:1/2:1/4:1/4, and the successive approximation logic circuit 1303 performs sampling by connecting the analog input signal AIN to one ends of the plural capacitors during the sampling period.

In the next hold period, the successive approximation logic circuit 1303 separates all the capacitors from the ground to hold the taken-in charges.

The operation timing of the successive approximation type A/D converter shown in FIG. 27 is shown in FIG. 32.

In the configuration of the successive approximation type A/D converter 1300, as shown in FIG. 32, an initialization period, a comparison period, and a coding period are generated by the external input operation clock signal CKIN, and A/D conversion is carried out.

Accordingly, the performance of the conventional successive approximation type A/D converter 1300 is determined depending on the characteristic of the external input operation clock signal CKIN, like the conventional parallel type A/D converter 1200, and it is indispensable to supply the external input operation clock signal CKIN during the operation.

Patent Document 1: Japanese Published Patent Application No. 2003-158456
Patent Document 2: Japanese Published Patent Application No. Hei.5-259913

SUMMARY OF THE INVENTION

By the way, in recent systems using the above-described A/D converter, a high-speed operation clock is required, and a sufficient comparison period cannot be taken due to influences of duty and jitter of the external input operation clock signal, and thereby it becomes difficult to maintain the conversion precision.

The present invention is made to solve the above-described problems and has for its object to provide an A/D converter which can secure the respective A/D conversion operation periods of the A/D converter, can be operated with a clock signal having duty, frequency, and jitter which are most suitable for the A/D converter, and can achieve high-speed operation, low power consumption, and high conversion precision.

In order to solve the above-described problems, an A/D converter according to a first aspect of the present invention comprises a reference voltage generation circuit for generating a reference voltage which is a comparison target when converting an analog input signal into a digital output signal; a comparison circuit for comparing the analog input signal with the reference voltage; a logic circuit for outputting a digital output signal corresponding to the analog input signal on the basis of the output result of the comparison circuit; and a clock generator circuit for generating operation clock signals to be supplied to the comparison circuit and the logic circuit using, as a trigger, a start signal which starts the A/D converter to operate.

According to a second aspect of the present invention, in the A/D converter defined in the first aspect, the clock generator circuit has a delay circuit for delaying the start signal, and generates the operation clock signals by feedbacking an output signal from the delay circuit.

According to a third aspect of the present invention, in the A/D converter defined in the second aspect, the clock generator circuit further includes a phase comparator which compares the phase of the input signal to the delay circuit with the phase of the output signal from the delay circuit, and supplies its output to the delay circuit as a control signal for controlling the delay amount of the delay circuit.

According to a fourth aspect of the present invention, in the A/D converter defined in the second aspect or third aspect, the delay time of the delay circuit in the clock generator circuit is variable.

According to a fifth aspect of the present invention, in the A/D converter defined in any of the first aspect to the fourth aspect, the clock generator circuit includes an operation time detection circuit for detecting an operation time of any circuit among the reference voltage generation circuit, the comparison circuit, and the logic circuit which are the constituents of the A/D converter, and generates the operation clock signal according to the detected operation time.

According to a sixth aspect of the present invention, in the A/D converter defined in the fifth aspect, the operation time of said any circuit for which the operation time is detected is a comparison operation time of the comparison circuit, and the operation clock is generated according to the detected comparison operation time.

According to a seventh aspect of the present invention, in the A/D converter defined in the fifth aspect, the operation time of said any circuit for which the operation time is detected is an initialization time of the comparison circuit, and the operation clock is generated according to the detected initialization time.

According to an eighth aspect of the present invention, in the A/D converter defined in the fifth aspect, the operation time of said any circuit for which the operation time is detected is a coding time of the logic circuit, and the operation clock is generated according to the detected coding time.

According to a ninth aspect of the present invention, in the A/D converter defined in the fifth aspect, the operation time of said any circuit for which the operation time is detected is an initialization time of the logic circuit, and the operation clock is generated according to the detected initialization time.

According to a tenth aspect of the present invention, in the A/D converter defined in the fifth aspect, the operation time of said any circuit for which the operation time is detected is a sum of a comparison operation time and an initialization time of the comparison circuit, and the operation clock is generated according to the time of the detected sum.

According to an eleventh aspect of the present invention, in the A/D converter defined in the fifth aspect, the operation time of said any circuit for which the operation time is detected is a sum of a coding time and an initialization time of the logic circuit, and the operation clock is generated according to the time of the detected sum.

According to a twelfth aspect of the present invention, in the A/D converter defined in the fifth aspect, the operation time of said any circuit for which the operation time is detected is a sum of a comparison time of the comparison circuit and a coding time of the logic circuit, and the operation clock is generated according to the time of the detected sum.

According to a thirteenth aspect of the present invention, in the A/D converter defined in the fifth aspect, the operation time of said any circuit for which the operation time is detected is a sum of an initialization time of the comparison circuit and an initialization time of the logic circuit, and the operation clock is generated according to the time of the detected sum.

According to a fourteenth aspect of the present invention, in the A/D converter defined in the fifth aspect, the clock generator circuit halts the operation of said any circuit for which the operation time is detected among the reference voltage generation circuit, the comparison circuit, and the logic circuit, during a time other than the operation time detected by the operation time detection circuit.

According to a fifteenth aspect of the present invention, in the A/D converter defined in the first aspect, the start signal is a rising edge of a power supply which is supplied to any of the circuits which are the constituents of the A/D converter.

According to the present invention, since the clock generator circuit which requires no external input clock is provided inside the A/D converter, an external clock oscillator is dispensed with.

Further, since an optimum operation clock for the A/D converter is generated without depending on the characteristics of the external input clock, the A/D converter can be operated with the optimum operation clock, thereby achieving high-speed operation, low power consumption, and high conversion precision of the A/D converter.

BRIEF DESCRIPTION OF THE DRAWINGS

FIG. 31 is an operation timing chart of the configuration shown in FIG. 30.

FIG. 32 is an operation timing chart of the configuration shown in FIG. 27.

DESCRIPTION OF REFERENCE NUMERALS

Figure 1:
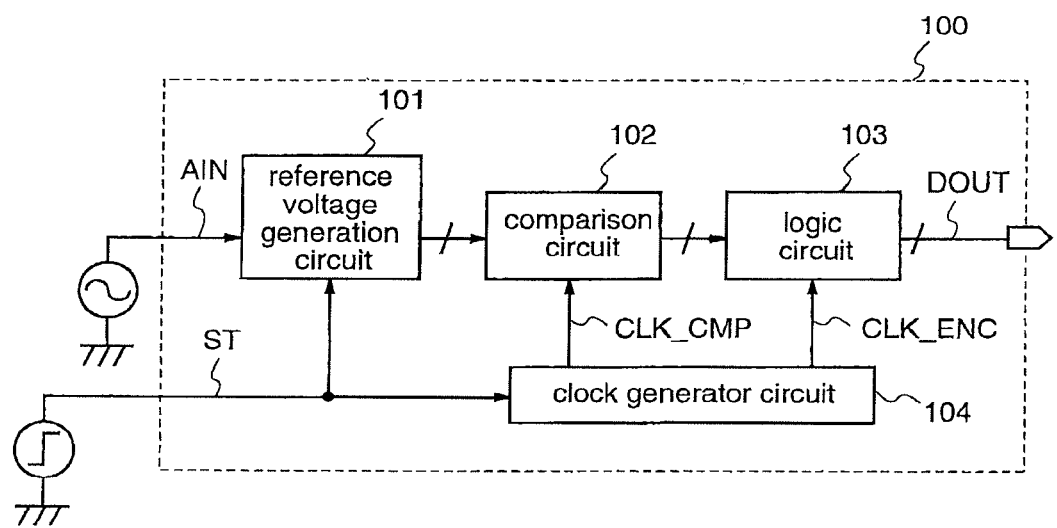
FIG. 1 is a diagram illustrating an A/D converter 100 according to a first embodiment of the present invention.

100 . . . A/D converter
101 . . . reference voltage generation circuit
102 . . . comparison circuit
103 . . . logic circuit
104 . . . clock generator circuit
105 . . . start signal generation circuit
200 . . . A/D converter
201 . . . reference voltage generation circuit
202 . . . comparison circuit
203 . . . logic circuit
204 . . . clock generator circuit
205 . . . start signal generation circuit
300 . . . clock generator circuit
301 . . . delay circuit
302 . . . AND
303 . . . EXOR
400 . . . clock generator circuit
401 . . . delay circuit
402 . . . AND
403 . . . EXOR
404 . . . first INV
500 . . . clock generator circuit
501 . . . delay circuit
502 . . . AND
503 . . . EXOR
504 . . . phase comparison circuit
505 . . . first INV
600 . . . clock generator circuit
601 . . . variable delay circuit
602 . . . AND
603 . . . EXOR
604 . . . first INV
700 . . . clock generator circuit
701 . . . variable delay circuit
702 . . . AND
703 . . . EXOR
704 . . . first INV
705 . . . operation time detection circuit
800 . . . operation time detection circuit
801 . . . comparator
802 . . . first resistor
803 . . . second resistor
805 . . . comparison circuit
806 . . . first switch
807 . . . second INV
808 . . . switch group
809 . . . capacitor group
900 . . . operation time detection circuit
901 . . . first comparator
902 . . . second comparator
903 . . . third resistor
904 . . . fourth resistor
905 . . . comparison circuit
906 . . . reference voltage generation circuit
1000 . . . operation time detection circuit
1001 . . . third comparator
1002 . . . fifth resistor
1003 . . . sixth resistor
1004 . . . operation time detection support circuit
1005 . . . seventh resistor
1006 . . . second switch
1007 . . . third switch
1008 . . . comparison circuit
1009 . . . reference voltage generation circuit
1100 . . . operation time detection circuit
1101 . . . logic circuit
1200 . . . A/D converter
1201 . . . reference voltage generation circuit
1202 . . . comparison circuit
1203 . . . logic circuit
1204 . . . clock buffer
1300 . . . A/D converter
1301 . . . reference voltage generation circuit
1302 . . . comparison circuit
1303 . . . logic circuit
1501 . . . PMOS transistor
1502 . . . NMOS transistor
1503 . . . first capacitor
1504 . . . second capacitor
1505 . . . first inverter
1506 . . . second inverter
AIN . . . analog input signal
CKIN . . . external input operation clock signal
CLK_CMP . . . comparison circuit operation clock signal CLK_ENC . . . logic circuit operation clock signal
CLK . . . first clock signal
CLKA . . . second clock signal
CLKB . . . third clock signal
DOUT . . . digital output signal
ST . . . start signal
CONTA . . . detection signal
VDD . . . power supply voltage
VSS . . . ground voltage
Va . . . first input signal
Vb . . . second input signal
CONT . . . control signal
AIN . . . analog input signal
VREFH . . . first reference voltage signal
VREFL . . . second reference voltage signal
VREFM1 . . . third reference voltage signal
VREFM2 . . . fourth reference voltage signal
CMPOUT . . . comparison result output signal

DETAILED DESCRIPTION OF THE INVENTION

Hereinafter, the embodiments of the present invention will be described with reference to the drawings.

Embodiment 1

FIG. 1 is a block diagram illustrating a parallel type A/D converter 100 according to a first embodiment of the present invention.

The A/D converter 100 of this first embodiment shown in FIG. 1 is configured by, in order to convert an analog input signal into a digital output signal, a reference voltage generation circuit 101 which generates a reference voltage to be a comparison target, a comparison circuit 102 which compares the reference voltage generated by the reference voltage generation circuit 101 with an analog input signal AIN, a logic circuit 103 which outputs a digital output signal based on the output result of the comparison circuit 101, and a clock generator circuit 104 which automatically generates operation clocks CLK_CMP and CLK_ENC according to a start signal ST.

Figure 2:
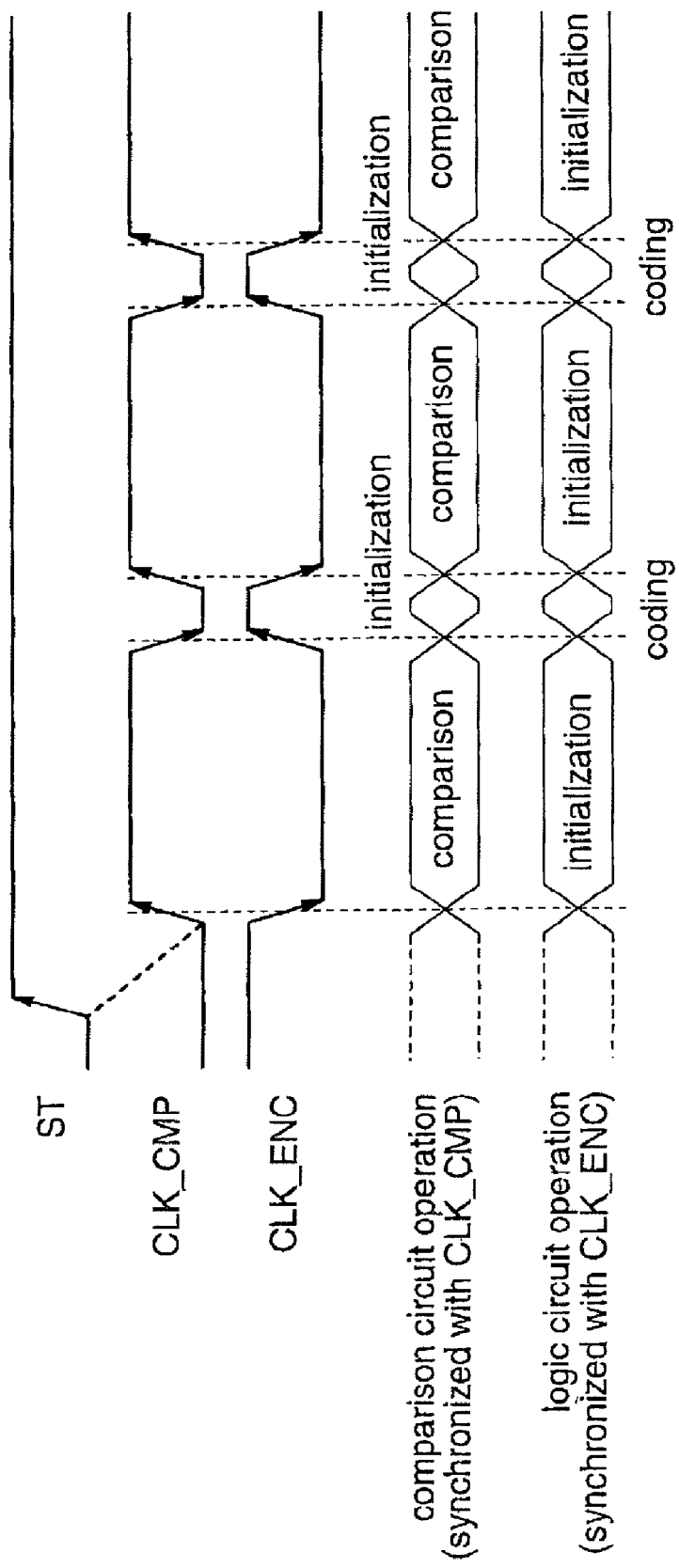
FIG. 2 is an operation timing chart of the A/D converter 100 of the first embodiment.

FIG. 2 shows the operation timing chart of the A/D converter 100 of this first embodiment.

During the periods of "LOW" and "HIGH" of the comparison circuit operation clock signal CLK_CMP shown in FIG. 2, the comparison circuit 102 performs an initialization operation and a comparison operation, respectively.

The comparison circuit operation clock signal CLK_CMP and the logic circuit operation clock signal CLK_ENC are synchronized with each other and are inverted in phase from each other. Therefore, when the comparison circuit 102 ends the comparison operation, the coding circuit (logic circuit 103) starts the coding operation in synchronization with the end of the comparison operation, and the next-cycle comparison operation is started after the coding operation is ended. Thereby, the comparison operation and the coding operation can be alternately performed.

By the way, the clock generator circuit 104 generates the comparison circuit operation clock signal CLK_CMP and the logic circuit operation clock signal CLK_ENC in the A/D converter 100 using the start signal ST as a trigger. Therefore, the external input operation clock signal CKIN which is required in the conventional circuit can be dispensed with.

Further, since the clock generator circuit 104 is one for simply generating the clock signals using the start signal ST as a trigger, it can generate the comparison circuit operation clock signal CLK_CMP and the logic circuit operation clock signal CLK_ENC having predetermined signal specification (such as amplitude, frequency, duty, and jitter) regardless of the external clock signal.

Therefore, it is possible to appropriately secure the comparison period and the initialization period which are required for the operation of the comparison circuit 102 and the initialization period and the coding period which are required for the operation of the logic circuit 103, by optimally setting the comparison circuit operation clock signal CLK_CMP and the logic circuit operation clock signal CLK_ENC.

As the result, the A/D conversion can be performed with high speed, high precision, and low power consumption.

As described above, according to the first embodiment, since the clock signal is generated by the clock generator circuit 104 provided inside the parallel type A/D converter and A/D conversion is performed using this clock signal, an external clock oscillator is dispensed with. Further, a clock signal having optimum duty, frequency, and jitter can be supplied to the A/D converter by appropriately setting the specification of the clock generator circuit 104, and thereby the A/D converter can be optimally operated, resulting in the A/D converter which can achieve high speed operation, low power consumption, and high conversion precision.

The start signal may be generated using a rising edge of the power supply voltage which is supplied to the A/D converter of this first embodiment or to any of the circuits constituting the A/D converter.

Modification of Embodiment 1

Figure 3:
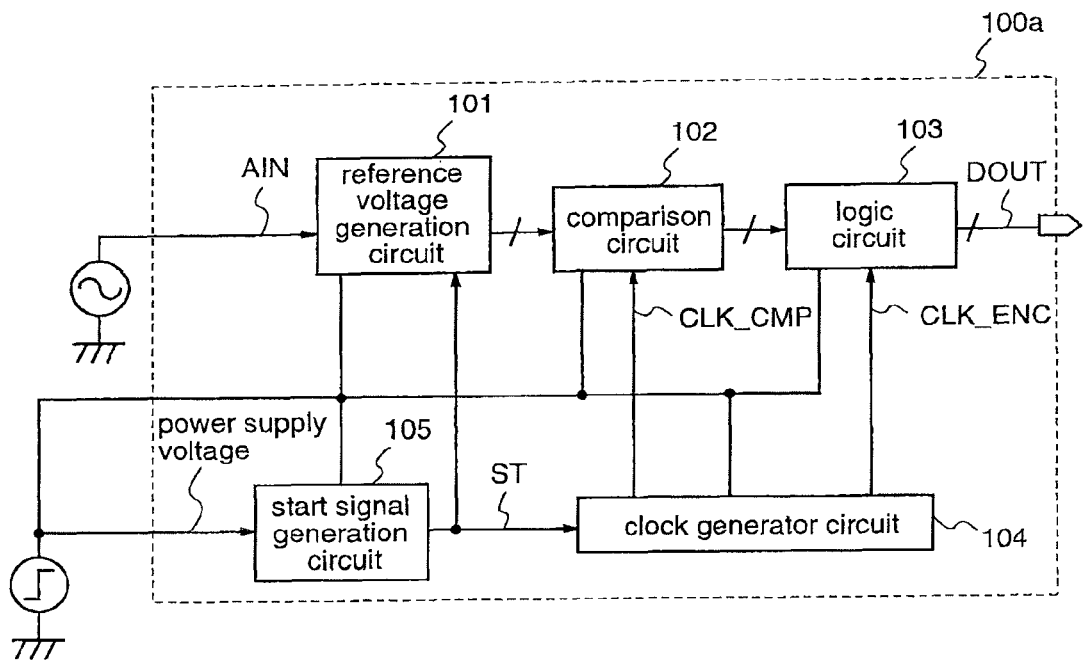
FIG. 3 is a diagram illustrating an A/D converter 100*a* according to a modification of the first embodiment.

FIG. 3 shows an example of an A/D converter 100a according to a modification of the first embodiment.

The A/D converter 100a of the modification of the first embodiment shown in FIG. 3 is configured by a start signal generation circuit (detection circuit) 105 which generates a start signal ST at a rising of the power supply voltage, a comparison circuit 102 which compares a reference voltage generated by the reference voltage generation circuit 101 with an analog input signal AIN, a logic circuit 103 which outputs a digital output signal based on the output result of the comparison circuit 102, and a clock generator circuit 104 which automatically generates operation clocks CLK_CMP and CLK_ENC according to the start signal ST.

By adopting this configuration, the above-described start signal ST can be generated inside the A/D converter 100a by detecting a rising (rising edge) of the power supply voltage which is supplied to any of the circuits constituting the A/D converter 100a, i.e., the reference voltage generation circuit 101, the comparison circuit 102, the logic circuit 103, and the clock generator circuit 104, or a rising (rising edge) of the power supply voltage which is supplied to this A/D converter 100a.

Figure 4:
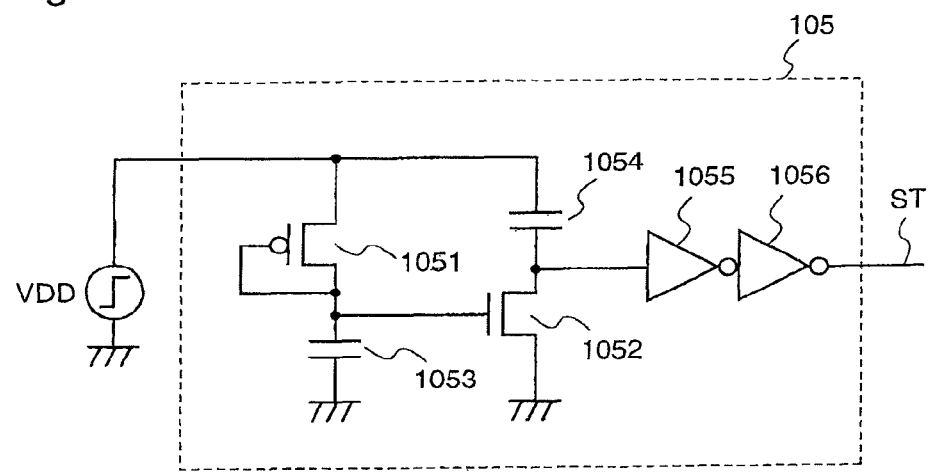
FIG. 4 is a diagram illustrating a start signal generation circuit 105 according to a modification of the first embodiment.

FIG. 4 shows an example of the start signal generation circuit 105 in the modification of the first embodiment.

In FIG. 4, a diode-connected PMOS transistor 1051 and a first capacitor 1053 are connected in series with each other in this order, and a second capacitor 1054 and a NMOS transistor 1052 are connected in series with each other in this order, between the non-grounded-side node of the power supply VDD and the ground.

Further, a connection node of the PMOS transistor 1051 and the first capacitor 1053 is connected to a gate of the NMOS transistor 1052, and the start signal ST can be taken out from a connection node of the second capacitor 1054 and the NMOS transistor 1052 via inverters 1055 and 1056.

Figure 5:
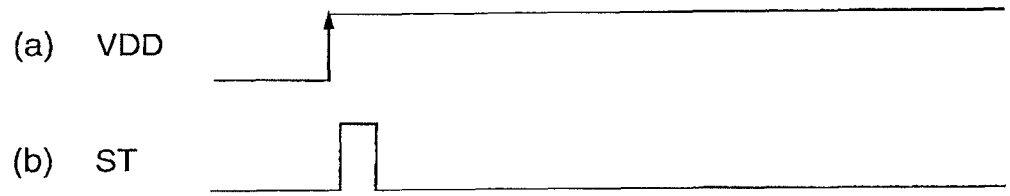
FIG. 5 is an operation timing chart of the start signal generation circuit shown in FIG. 4.

FIG. 5 shows the input/output operation time charts of the start signal generation circuit 105.

In FIG. 4, the PMOS transistor 1051 starts to operate at a rising edge of the power supply VDD shown in FIG. 5(a), and supplies electric charges to the first capacitor 1053. When the voltage charged in the first capacitor 1053 exceeds a threshold value of the operation of the NMOS transistor 1052, the NMOS transistor 1052 starts to operate, and discharges the charging voltage of the second capacitor 1054 which has been charged by the power supply VDD.

Thereby, the input voltage of the first inverter 1505 transits from "HIGH" to "LOW", and this input voltage is delayed by the first and second inverters 1055 and 1056, thereby to generate the start signal ST shown in FIG. 5(b).

The start signal generation circuit can be realized by any configuration other than mentioned above.

As described above, according to the modification of the first embodiment, since the start signal generation circuit 105 is added to the configuration of the first embodiment, the start signal can be generated inside the A/D converter, and it becomes unnecessary to input an external start signal, which dispenses with a start signal generation circuit to be provided outside the A/D converter.

Embodiment 2

Figure 6:
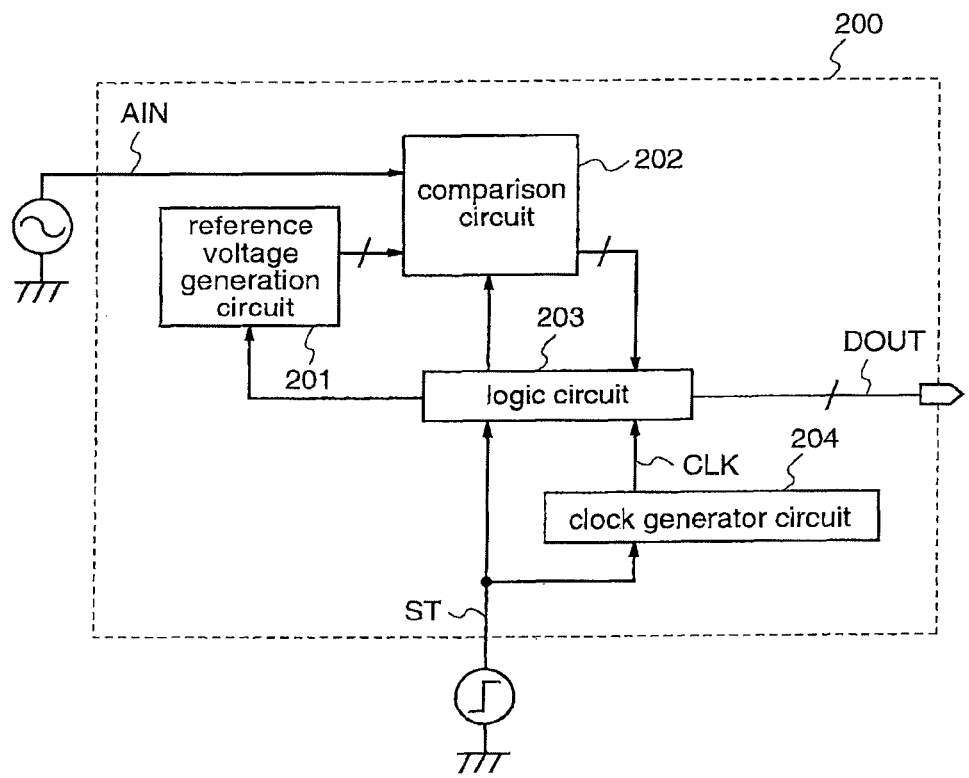
FIG. 6 is a diagram illustrating an A/D converter 200 according to a second embodiment of the present invention.

FIG. 6 is a block diagram illustrating a successive approximation type A/D converter 200 according to a second embodiment of the present invention.

The A/D converter 200 of this second embodiment shown in FIG. 6 is configured by, in order to convert an analog input signal into a digital output signal, a reference voltage generation circuit 201 which generates a reference voltage to be a comparison target, a comparison circuit 202 which compares the reference voltage generated by the reference voltage generation circuit 201 with an analog input signal AIN, a logic circuit 203 which outputs a digital output signal according to a first operation clock CLK on the basis of the output result of the comparison circuit 201, and a clock generator circuit 204 which automatically generates the first operation clock CLK according to a start signal ST.

Figure 7:
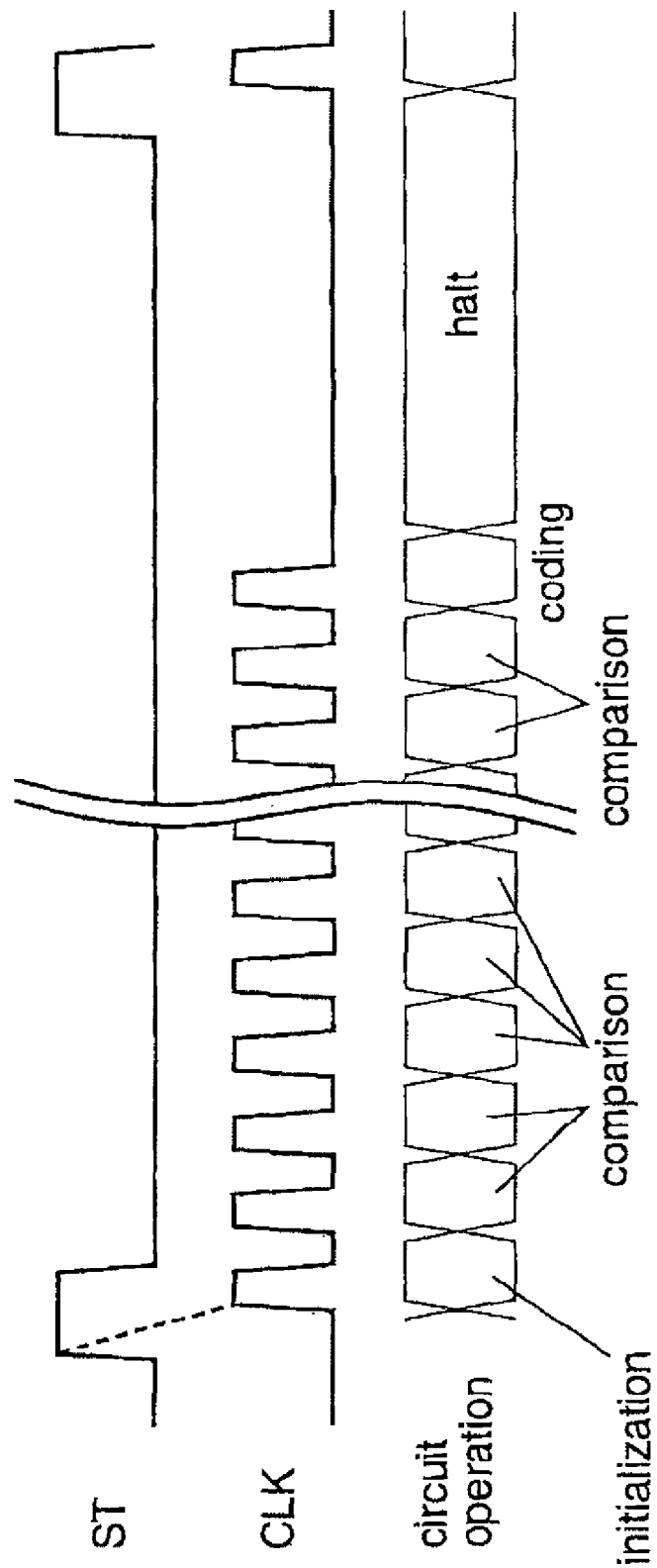
FIG. 7 is an operation timing chart of the A/D converter 200 of the second embodiment.

FIG. 7 shows the operation timing chart of the A/D converter 200 of this second embodiment.

The clock generator circuit 204 generates the first operation clock signal CLK having a predetermined signal specification in the A/D converter 200 using the start signal ST as a trigger. Accordingly, the external input operation clock signal CKIN which is required in the conventional circuit can be dispensed with, and A/D conversion is carried out during the comparison period and the initialization period which are required for the operation of the comparison circuit 202 and the coding period which is required for the operation of the logic circuit 203.

As described above, according to the second embodiment, since a clock signal is generated by the clock generator circuit 204 provided in the successive approximation type A/D converter and A/D conversion is performed using the clock signal, an external clock oscillator is dispensed with. Further, a clock signal having optimum duty, frequency, and jitter can be supplied to the A/D converter by appropriately setting the specification of the clock generator circuit 204, and thereby the A/D converter can be optimally operated, resulting in an A/D converter which can achieve high-speed operation, low power consumption, and high conversion precision.

The start signal may be generated using a rising edge of the power supply voltage which is supplied to the A/D converter of this second embodiment or to any of the circuits constituting the A/D converter.

Modification of Embodiment 2

Figure 8:
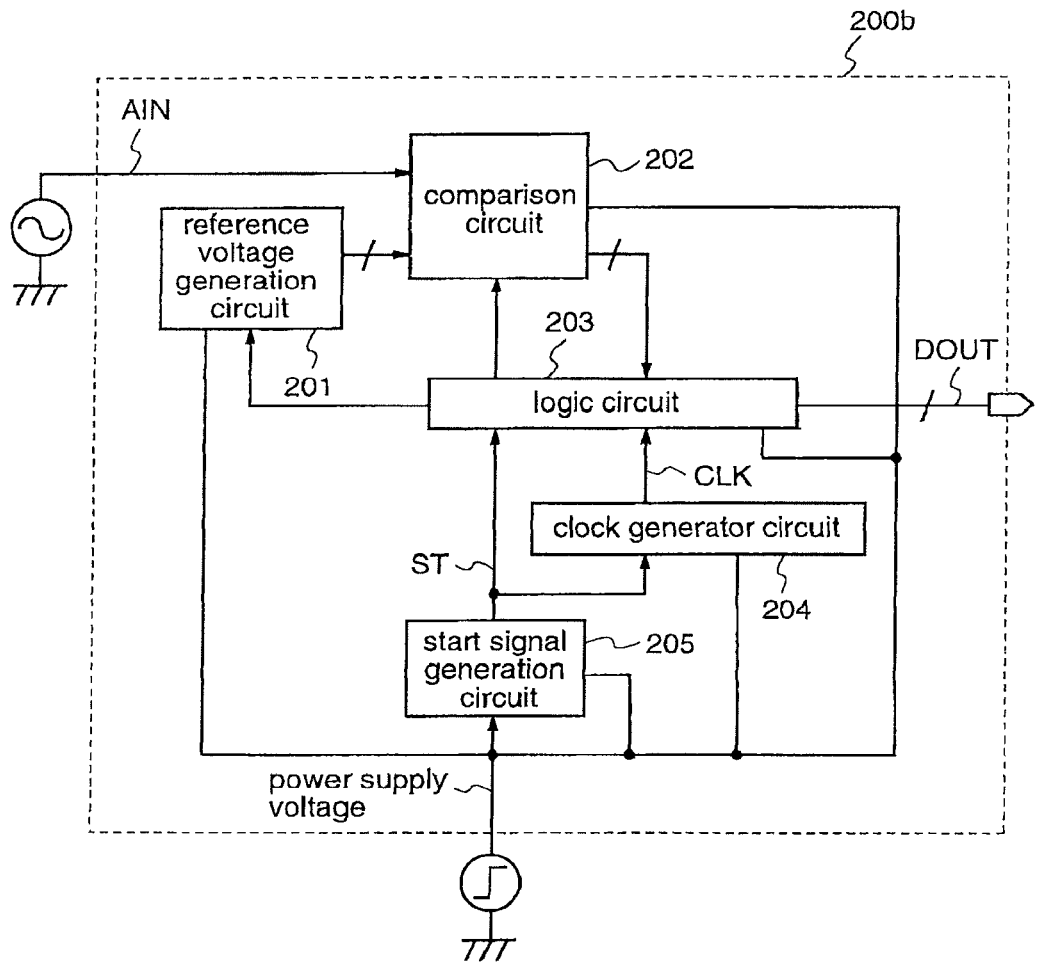
FIG. 8 is a diagram illustrating an A/D converter 200*b* according to a modification of the second embodiment.

FIG. 8 shows an example of an A/D converter 200b according to a modification of the second embodiment.

The A/D converter 200b of the modification of the second embodiment shown in FIG. 8 is configured by a start signal generation circuit (detection circuit) 205 which generates a start signal ST at a rising of the power supply voltage, a comparison circuit 202 which compares a reference voltage generated by s reference voltage generation circuit 201 with an analog input signal AIN, a logic circuit 203 which outputs a digital output signal based on the output result of the comparison circuit 202, and a clock generator circuit 204 which automatically generates operation clocks CLK_CMP and CLK_ENC according to the start signal ST.

By adopting this configuration, the above-described start signal ST can be generated inside the A/D converter 200b by detecting a rising (rising edge) of the power supply voltage which is supplied to any of the circuits constituting the A/D converter 200b, i.e., the reference voltage generation circuit 201, the comparison circuit 202, the logic circuit 203, and the clock generator circuit 204, or a rising (rising edge) of the power supply voltage which is supplied to this A/D converter 200b.

While the start signal generation circuit 205 of the modification of the second embodiment may have the same configuration as the start signal generation circuit 105 of the modification of the first embodiment shown in FIG. 4, it may have other configurations.

As described above, according to the modification of the second embodiment, since the start signal generation circuit 205 is added to the configuration of the second embodiment, the start signal can be generated inside the A/D converter and thereby it becomes unnecessary to supply an external start signal, which dispenses with a start signal generation circuit being provided outside the A/D converter.

(Configuration Example 1 of Clock Generator Circuit)

Hereinafter, a configuration example of a clock generator circuit which can be used in the A/D converter of the first or second embodiment will be described.

Figure 9:
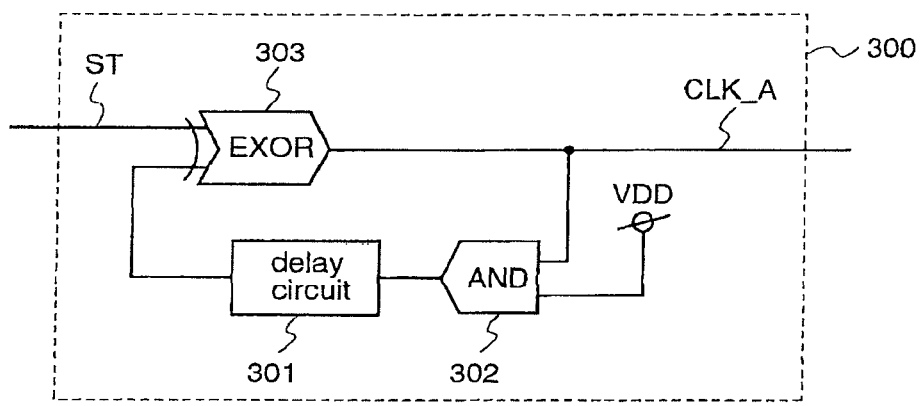
FIG. 9 is a diagram illustrating a configuration example of a clock generator circuit 300.

FIG. 9 shows a configuration example of a clock generator circuit 300 which can be used as the clock generator circuit 204 in the A/D converter 200 of the second embodiment.

The clock generator circuit 300 shown in FIG. 9 is configured as follows.

That is, a start signal ST of the clock generator circuit 300 is connected to one input of an exclusive OR circuit (hereinafter referred to as EXOR) 303, and an output of the EXOR 303 becomes a second clock signal CLK_A to be connected to one input of an AND 302, while the other end of the AND 302 is connected to the power supply voltage VDD.

An output of the AND 302 is connected to a delay circuit 301, and an output of the delay circuit 31 is connected to the other input of the EXOR 303, thereby configuring the clock generator circuit 300.

When the start signal ST rises from "LOW" to "HIGH", the output of the EXOR 303 rises from "LOW" to "HIGH". Thereby, the output of the AND 302 becomes "HIGH", and the other input of the EXOR 303 becomes "HIGH" after a delay time set on the delay circuit 301 has passed. As the result, the second clock signal CLK_A is continuously generated by repeating the operation of generating one second clock signal CLD_A every time the output of the EXOR 303 returns to "LOW" and thereby the start signal ST rises from "LOW" to "HIGH". The duty of this second clock signal CLK_A depends on the delay time which is set on the delay circuit 301.

Accordingly, it also becomes unnecessary to provide the external input operation clock signal CKIN which is required in the conventional circuit by using the second clock signal CLK_A instead of the first operation clock signal CLK used in the second embodiment.

As described above, since the clock generator circuit which generates the first operation clock signal using the start signal ST as a trigger is configured by combining the simple logic circuits in the A/D converter 200 of the second embodiment, it becomes unnecessary to provide a clock generator outside the A/D converter, which generates an external input operation clock signal for generating the first operation clock signal, and thereby cost and space for the clock generation can be deleted.

Further, since the signal specification of the first operation clock signal can be determined without depending on the signal specification of the external input operation clock signal by appropriately setting the delay time of the delay circuit in the clock generator circuit, the A/D converter which includes this clock generator circuit can be operated with a clock signal having optimum duty, frequency, and jitter, thereby realizing an A/D converter which can achieve high-speed operation, low power consumption, and high conversion precision.

(Configuration Example 2 of Clock Generator Circuit)

Figure 10:
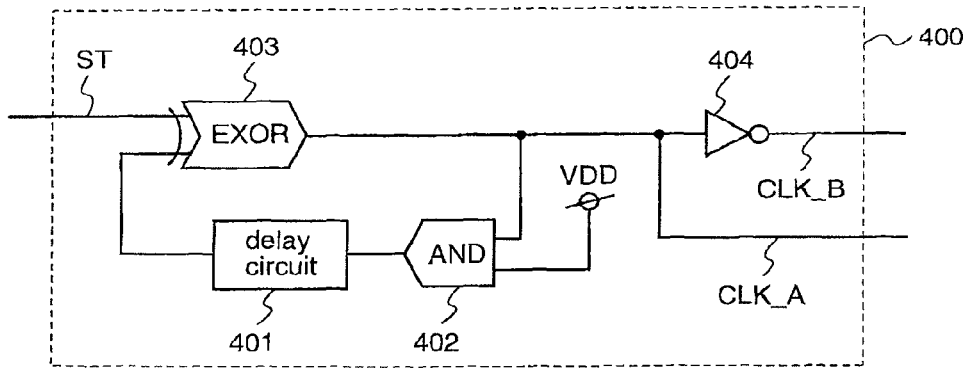
FIG. 10 is a diagram illustrating a configuration example of a clock generator circuit 400.

FIG. 10 shows a configuration example of a clock generator circuit 400 which can be used as the clock generator circuit 104 in the A/D converter 100 of the first embodiment.

The clock generator circuit 400 shown in FIG. 10 is configured as follows.

That is, a start signal ST of the clock generator circuit 400 is connected to one input of an EXOR 403, an output of the EXOR 403 is connected to one input of an AND 402 and to an input of a first inverter (hereinafter referred to as INV) 404, the other input of the AND 402 is connected to the power supply voltage VDD, an output of the AND 402 is connected to a delay circuit 401, and an output of the delay circuit 401 is connected to the other input of the EXOR 403, thereby configuring the clock generator circuit 400.

This configuration corresponds to the clock generator circuit 300 shown in FIG. 9 to which the first INV 404 is added, and the output of the EXOR 403 becomes a second clock signal CLK_A while the output of the first INV 404 becomes a third clock signal CLK_B.

Accordingly, it also becomes unnecessary to provide the external input operation clock signal CKIN which is required in the conventional circuit by using the second clock signal CLK_A instead of the comparison circuit operation clock signal CLK_CMP in the first embodiment and the third clock signal CLK_B instead of the third clock signal CLK_B in the first embodiment, respectively.

The second clock signal CLK_A may be used instead of the logic circuit operation clock signal CLK_ENC in the first embodiment, and the third clock signal CLK_B may be used instead of the comparison circuit operation clock signal CLK_CMP in the first embodiment, respectively.

As described above, since the clock generator circuit which generates the first operation clock signal using the start signal ST as a trigger is configured by combining the simple logic circuits in the A/D converter 100 of the first embodiment, it becomes unnecessary to provide a clock generator outside the A/D converter, which generates an external input operation clock signal for generating the comparison circuit operation clock signal and the logic circuit operation clock signal, and thereby cost and space for the clock generator can be deleted.

Further, the signal specifications of the comparison circuit operation clock signal and the logic circuit operation clock signal can be determined without depending on the signal specification of the external input operation clock signal by appropriately setting the delay time of the delay circuit in the clock generator circuit, and thereby the A/D converter which includes this clock generator circuit can be operated with a clock signal having optimum duty, frequency, and jitter, resulting in an A/D converter which can achieve high-speed operation, low power consumption, and high conversion precision.

(Configuration Example 3 of Clock Generator Circuit)

Figure 11:
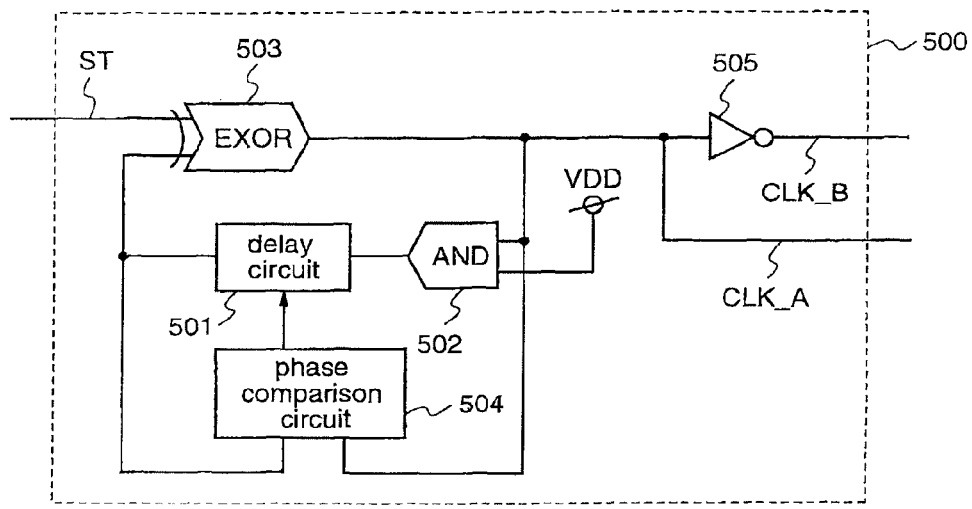
FIG. 11 is a diagram illustrating a configuration example of a clock generator circuit 500.

FIG. 11 shows a configuration example of a clock generator circuit 500 which can be used as the clock generator circuit 104 in the A/D converter 100 of the first embodiment or as the clock generator circuit 204 in the A/D converter 200 of the second embodiment.

The clock generator circuit 500 shown in FIG. 11 is configured as follows. That is, a start signal ST of the clock generator circuit 500 is connected to one input of an EXOR 503, and an output of the EXOR 503 becomes a second clock signal CLK_A and is connected to one input of an AND 502, an input of a first INV 505, and one input of a phase comparator 504.

An output of the first INV 505 becomes a third clock signal CLK_B, the other input of the AND 502 is connected to the power supply voltage VDD, an output of the AND 502 is connected to a delay circuit 501, an output of the delay circuit 501 is connected to the other input of the EXOR 503 and to the other input of the phase comparator 504, and an output of the phase comparator 504 is connected to the delay circuit 501 in order to determine a delay amount of the delay circuit 501, thereby configuring the clock generator circuit 500.

Accordingly, the input signal to the delay circuit 501 is compared with its output signal by the phase comparator 504, and the delay amount of the delay circuit 501 can be constantly controlled according to the comparison result. Therefore, the clock widths of the second clock signal CLK_A and the third clock signal CLK_B can be constantly controlled without depending on the signal specification of the external input operation clock signal.

It also becomes unnecessary to provide the external input operation clock signal CKIN which is required in the conventional circuit by using the second clock signal CLK_A instead of the comparison circuit operation clock signal CLK_CMP in the first embodiment and the third clock signal CLK_B instead of the logic circuit operation clock signal CLK_ENC in the first embodiment, respectively.

The second clock signal CLK_A may be used instead of the logic circuit operation clock signal CLK_ENC in the first embodiment, and the third clock signal CLK_B may be used instead of the comparison circuit operation clock signal CLK_CMP in the first embodiment. Also in this configuration, the external input operation clock signal CKIN can be dispensed with.

Further, when this clock generator circuit is used in the A/D converter of the second embodiment, either of the second clock signal CLK_A or the third clock signal CLK_B may be used instead of the first operation clock signal CLK, and thereby the external input operation clock signal CKIN can also be dispensed with.

As described above, since the clock generator circuit which generates the comparison circuit operation clock signal and the logic circuit operation clock signal or the first operation clock signal using the start signal ST as a trigger is configured by combining the simple logic circuits in the A/D converter 100 of the first or second embodiment, it becomes unnecessary to provide a clock generator outside the A/D converter, which generates an external input operation clock signal for generating the comparison circuit operation clock signal and the logic circuit operation clock signal or the first operation clock signal, and thereby cost and space for the clock generator can be deleted.

Further, since the delay time of the delay circuit is constantly set according to the phase comparison result of the phase comparison circuit, the signal specifications of the comparison circuit operation clock signal and the logic circuit operation clock signal or the first operation clock signal can be determined without depending on the signal specification of the external input operation clock signal, and thereby the A/D converter which includes this phase comparison circuit can be operated with a clock signal having optimum duty, frequency, and jitter, resulting in an A/D converter which can achieve high-speed operation, low power consumption, and high conversion precision.

(Configuration Example 4 of Clock Generator Circuit)

Figure 12:
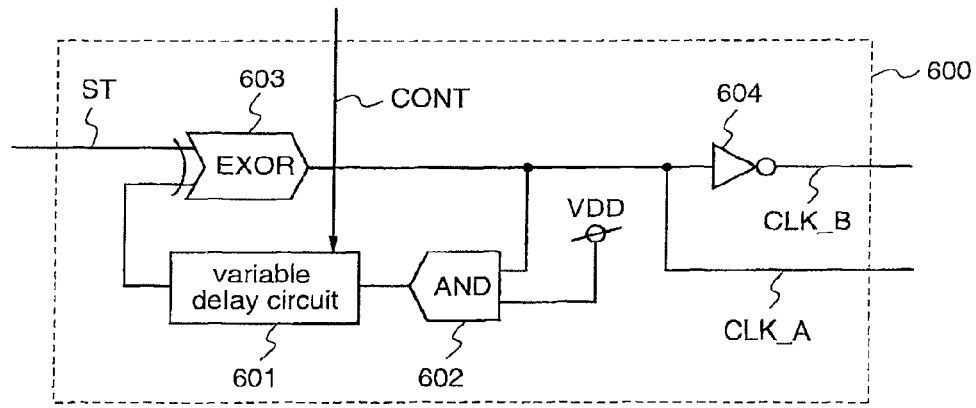
FIG. 12 is a diagram illustrating a configuration example of a clock generator circuit 600.

FIG. 12 shows a configuration example of a clock generator circuit 600 which can be used as the clock generator circuit 104 in the A/D converter 100 of the first embodiment or as the clock generator circuit 204 in the A/D converter 200 of the second embodiment.

The clock generator circuit 600 shown in FIG. 12 is configured as follows. That is, a start signal ST of the clock generator circuit 600 is connected to one input of an EXOR 603, and an output of the EXOR 603 becomes a second clock signal CLK_A and is connected to one input of an AND 602 and to an input of a first INV 604.

An output of the first INV 604 becomes a third clock signal CLK_B, the other input of the AND 602 is connected to the power supply voltage VDD, an output of the AND 602 is connected to a variable delay circuit 601, an output of the variable delay circuit 601 is connected to the other input of the EXOR 603, and a control signal CONT is connected to the variable delay circuit 601 in order to vary the delay amount of the variable delay circuit 601, thereby configuring the clock generator circuit 600.

Accordingly, the delay amount of the variable delay circuit 601 can be controlled by the control signal CONT so as to obtain an optimum duty for operating the A/D converter.

It also becomes unnecessary to provide the external input operation clock signal CKIN which is required in the conventional circuit by using the second clock signal CLK_A instead of the comparison circuit operation clock signal CLK_CMP in the first embodiment and the third clock signal CLK_B instead of the logic circuit operation clock signal CLK_ENC in the first embodiment, respectively.

When this clock generator circuit is used in the A/D converter of the first embodiment, the second clock signal CLK_A and the third clock signal CLK_B may be used instead of the logic circuit operation clock signal CLK_ENC and the comparison circuit operation clock signal CLK_CMP in the first embodiment, respectively. Also in this case, the external input operation clock signal CKIN can be dispensed with.

Further, when this clock generator circuit is used in the A/D converter of the second embodiment, either of the second clock signal CLK_A or the third clock signal CLK_B may be used instead of the first operation clock signal CLK. Also in this case, the external input operation clock signal CKIN can be dispensed with.

As described above, since the clock generator circuit which generates the comparison circuit operation clock signal and the logic circuit operation clock signal or the first operation clock signal using the start signal ST as a trigger is configured by combining the simple logic circuits in the A/D converter of the first or second embodiment, it becomes unnecessary to provide a clock generator outside the A/D converter, which generates an external input operation clock signal for generating the comparison circuit operation clock signal and the logic circuit operation clock signal or the first operation clock signal, and thereby cost and space for the clock generator can be deleted.

Further, by appropriately setting the delay time of the variable delay circuit, the signal specifications of the comparison circuit operation clock signal and the logic circuit operation clock signal or the first operation clock signal can be determined without depending on the signal specification of the external input operation clock signal, and thereby the A/D converter which includes the variable delay circuit can be operated with a clock signal having optimum duty, frequency, and jitter, resulting in an A/D converter which can achieve high-speed operation, low power consumption, and high conversion precision.

(Configuration Example 5 of Clock Generator Circuit)

Figure 13:
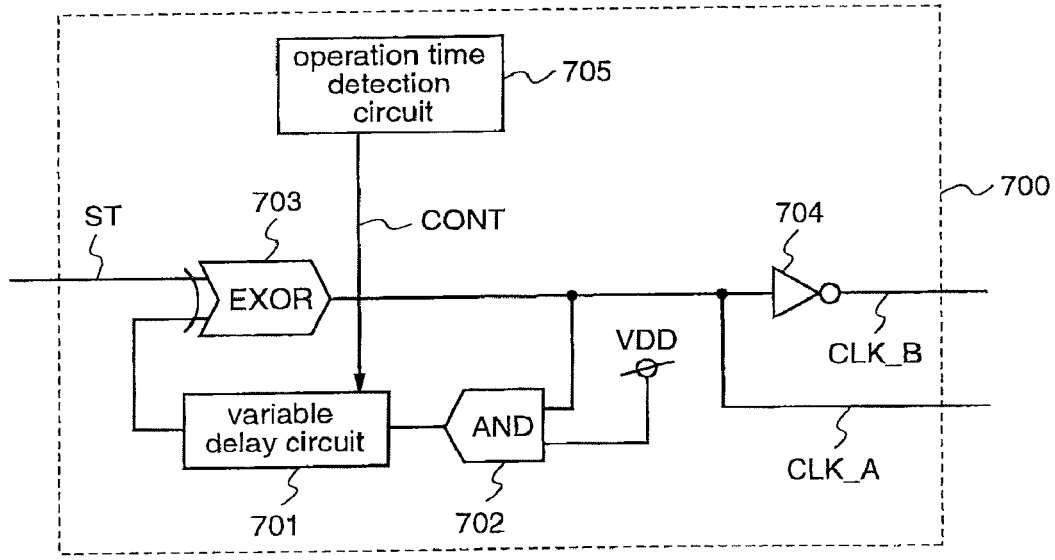
FIG. 13 is a diagram illustrating a configuration example of a clock generator circuit 700.

FIG. 13 shows a configuration example of a clock generator circuit 700 which can be used as the clock generator circuit 104 in the A/D converter 100 of the first embodiment or as the clock generator circuit 204 in the A/D converter 200 of the second embodiment.

The clock generator circuit 700 shown in FIG. 13 is configured as follows.

That is, a start signal ST of the clock generator circuit 700 is connected to one input of an EXOR 703, and an output of the EXOR 703 becomes a second clock signal CLK_A and is connected to one input of an AND 702 and to an input of a first INV 704.

An output of the first INV 704 becomes a third clock signal CLK_B, the other input of the AND 702 is connected to the power supply voltage VDD, an output of the AND 702 is connected to a variable delay circuit 701, an output of the variable delay circuit 701 is connected to the other input of the EXOR 703, an output of an operation time detection circuit 705 which detects the operation times of the constituents of the A/D converter, i.e., the reference voltage generation circuit 101, the comparison circuit 102, and the logic circuit 103, becomes a control signal CONT, and this control signal CONT is connected to the variable delay circuit 701 so as to vary the delay amount of the variable delay circuit 701, thereby configuring the clock generator circuit 700.

Accordingly, the A/D converter can be operated with the optimum operation clock by controlling the delay amount of the variable delay circuit 701 using the control signal CONT outputted from the operation time detection circuit 705 which detects the operation times of the constituents of the A/D converter, thereby obtaining an A/D converter which can achieve high-speed operation, low power consumption, and high conversion precision.

Further, when this clock generator circuit is used in the A/D converter of the first embodiment, the external input operation clock signal CKIN which is required in the conventional circuit can also be dispensed with by using the second clock signal CLK_A and the third clock signal CLK_B instead of the comparison circuit operation clock signal CLK_CMP and the logic circuit operation clock signal CLK_ENC in the first embodiment, respectively.

When this clock generator circuit is used in the A/D converter of the first embodiment, the second clock signal CLK_A and the third clock signal CLK_B may be used instead of the logic circuit operation clock signal CLK_ENC and the comparison circuit operation clock signal CLK_CMP in the first embodiment, respectively. Also in this case, the external input operation clock signal CKIN can be dispensed with.

Furthermore, when this clock generator circuit is used in the A/D converter of the second embodiment, either of the second clock signal CLK_A or the third clock signal CLK_B may be used instead of the first operation clock signal CLK. Also in this case, the external input operation clock signal CKIN can be dispensed with.

As described above, since the clock generator circuit which generates the comparison circuit operation clock signal and the logic circuit operation clock signal or the first operation clock signal using the start signal ST as a trigger is configured by combining the simple logic circuits in the A/D converter of the first or second embodiment, it becomes unnecessary to provide a clock generator outside the A/D converter, which generates an external input operation clock signal for generating the comparison circuit operation clock signal and the logic circuit operation clock signal or the first operation clock signal, and thereby cost and space for the clock generator can be deleted.

Further, since the delay time of the variable delay circuit is automatically set by the operation time detection circuit which detects the operation time of any of the reference voltage generation circuit, the comparison circuit, and the logic circuit which are constituents of the A/D converter, the signal specifications of the comparison circuit operation clock signal and the logic circuit operation clock signal or the first operation clock signal can be determined without depending on the signal specification of the external input operation clock signal, and thereby the A/D converter which includes the operation time detection circuit can be operated with a clock signal having optimum duty, frequency, and jitter, resulting in an A/D converter which can achieve high-speed operation, low power consumption, and high conversion precision.

(Configuration Example 1 of Operation Time Detection Circuit)

Hereinafter, a description will be given of a configuration example of an operation time detection circuit which can be used in the clock generator circuit 104 or 204 in the A/D converter of the first or second embodiment.

Figure 14:
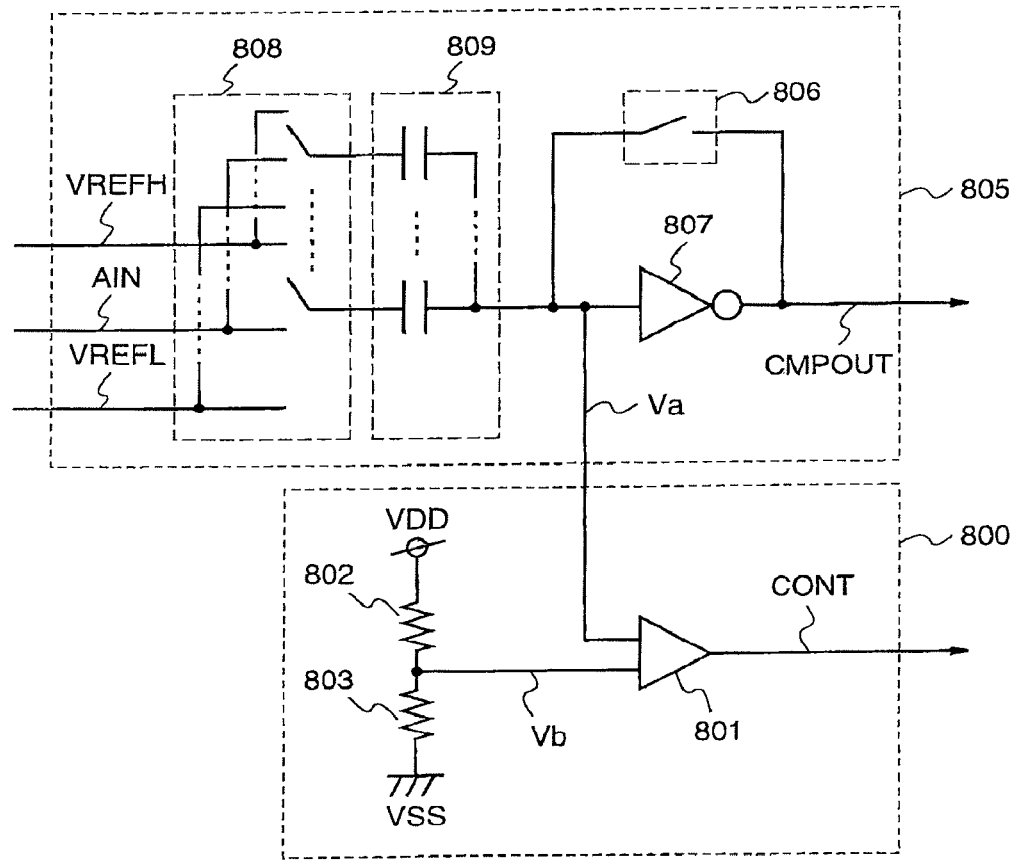
FIG. 14 is a diagram illustrating a configuration example of an operation time detection circuit 800.

FIG. 14 shows a configuration example of an operation time detection circuit 800 which can be used in the clock generator circuit 104 or 204 in the A/D converter of the first or second embodiment.

In FIG. 14, a comparison circuit 805 is composed of a first switch 806, a second INV 807, a switch group 808, and a capacitor group 809.

This comparison circuit 805 corresponds to the comparison circuit 202 shown in FIG. 6.

This comparison circuit 805 is configured such that the input and output of the inverter 807 are shorted by closing the first switch 806 to make the input voltage of the inverter 807 equal to its threshold value Vth. When, for example, VREFL is selected by the switch group 808, the voltage difference Vc between the input and output of the capacitor group 809 becomes Vc=VREFL−Vth. Next, when the first switch 806 is opened to select AIN by the switch group 808, the voltage difference Vc between the input and output of the capacitor group 809 is maintained at this value Vc, and thereby the input voltage V1 of the inverter 807 becomes Vi=AIN−(VREFL−Vth), and the comparison result is obtained according to whether Vi−Vth=AIN−VREF is larger or smaller than 0. That is, the comparison result is "HIGH" when Vi−Vth=AIN−VREF>0, and the comparison result is "LOW" when AIN−VREF<0.

Further, a first input signal Va to be input to the second INV 807 is connected to one input of a comparator 801 in the operation time detection circuit 800, and a second input signal Vb connected to the other input of the comparator 801 is a signal to be output from a node which is resistance-divided by first and second resistors 802 and 803 that are connected between the power supply voltage VDD and the ground voltage VSS.

The output signal from the comparator 801 is a control signal CONT. Further, the first and second resistors 802 and 803 have the same resistance value, and the voltage value of the second input signal Vb is "VDD/2".

Figure 15:
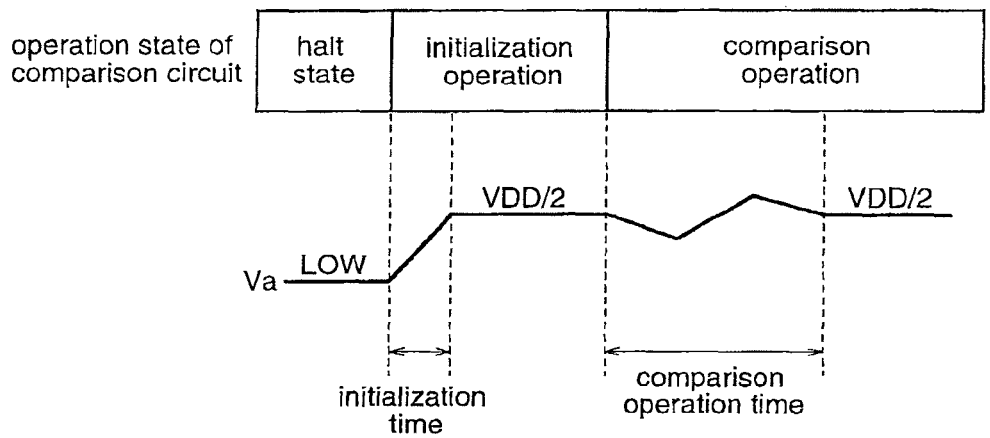
FIG. 15 is a operation timing chart of the configuration shown in FIG. 14.

FIG. 15 shows the operation timing chart of the configuration 800 shown in FIG. 14.

The first input signal Va is "LOW" when the comparison circuit 805 is in the halt state. When the first switch 806 is turned on and the switch group 808 is connected to the analog input signal AIN, the initialization operation of the comparison circuit 805 is started, and the first input signal Va becomes "VDD/2" when the initialization operation is ended (end of initialization time).

Further, when the first switch 806 is turned off and the switch group 808 is connected to the first reference voltage signal VREFH and the second reference voltage signal VREFL, the comparison operation of the comparison circuit 805 is started, and the comparison operation is ended (end of comparison operation time) when the first input signal Va again becomes "VDD/2".

By comparing the first input signal Va having such voltage variation with the second input signal Vb which is constant at "VDD/2", the initialization time and comparison operation time of the comparator 805 can be detected.

Accordingly, the A/D converter can be operated with the optimum operation clock by controlling the delay amount of the variable delay circuit 701 in the clock generator circuit 700 using the control signal CONT.

As described above, there is configured the operation time detection circuit which can detect the initialization time and comparison operation time of the comparison circuit by comparing the first input signal Va having voltage variation with the second input signal Vb that is constant at VDD/2 using the comparator 801. Therefore, the A/D converter can be operated with its optimum operation clock by controlling the delay amount of the variable delay circuit using the detected initialization time or comparison operation time of the A/D converter, thereby realizing an A/D converter which can achieve high-speed operation, low power consumption, and high conversion precision.

(Configuration Example 2 of Operation Time Detection Circuit)

Figure 16:
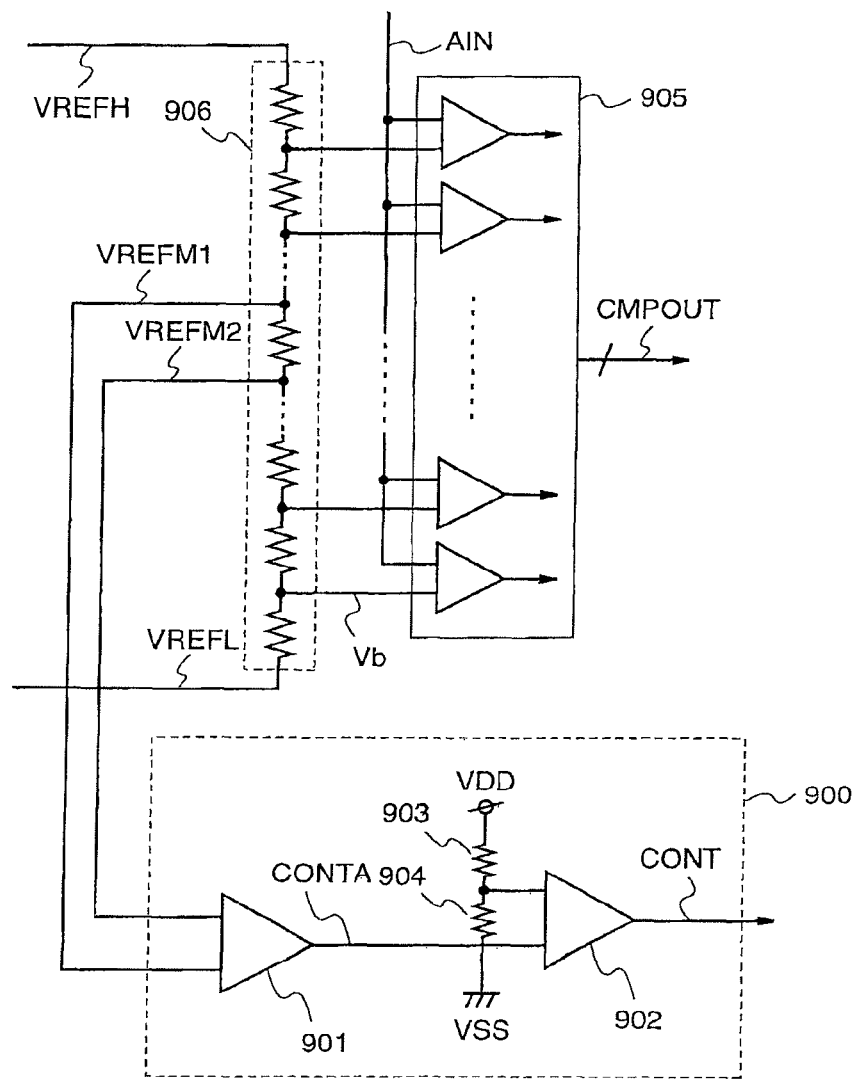
FIG. 16 is a diagram illustrating a configuration example of an operation time detection circuit 900.

FIG. 16 shows a configuration example of an operation time detection circuit 900 which can be used in the clock generator circuit 104 or 204 in the A/D converter of the first or second embodiment.

In FIG. 16, the A/D converter comprises a reference voltage generation circuit 906, a comparison circuit 905, and the operation time detection circuit 900, and a third reference voltage signal VREFM1 as an internal node of the reference voltage generation circuit 906 is connected to one input of a first comparator 901 in the operation time detection circuit 900.

Further, a fourth reference voltage signal VREFM2, sandwiching one resistor with the third reference voltage signal VREFM1 as the internal node of the reference voltage generation circuit 906, is connected to the other input of the first comparator 901, an output signal from the first comparator 901 is connected to one input of the second comparator 902, the other input of the second comparator 902 is connected to a node which is resistance-divided by third and fourth resistors 903 and 904 connected between the power supply voltage VDD and the ground voltage VSS, and an output of the second comparator serves as a control signal CONT.

The comparator 901 in the operation time detection circuit 900 is identical to one circuit in an initial-stage amplifier line 904, the third and fourth resistors 903 and 904 have the same resistance value, and the node which is resistance-divided by the third and fourth resistors 903 and 904 is "VDD/2".

Figure 17:
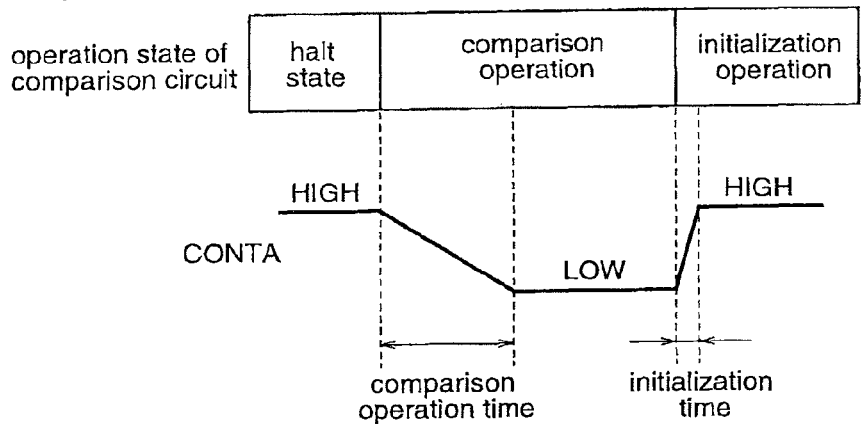
FIG. 17 is a operation timing chart of the configuration shown in FIG. 16.

FIG. 17 shows the operation timing chart of the configuration 900 shown in FIG. 16.

The output CONTA of the first comparator 901 is "HIGH" during the halt mode, and it becomes "LOW" due to a voltage difference between the third reference voltage signal VREFM1 and the fourth reference voltage signal VREFM 2 when the comparison operation of the comparison circuit 905 is started.

When performing initialization of the comparison circuit 905, the output of the first comparator 901 is fixed at "HIGH". Such voltage variation in the output of the first comparator 901 is compared with "VDD/2" by the second comparator, and a pulse waveform of the signal CONTA shown in FIG. 17 which has a duty of 50% and changes between "HIGH" and "LOW" in the center of the inclination of each comparison operation time and initialization time is outputted as an output control signal CONT, thereby detecting the initialization time and the comparison operation time of the comparison circuit 905.

Accordingly, the A/D converter can be operated with its optimum operation clock by controlling the delay amount of the variable delay circuit 701 in the clock generator circuit 700 using this control signal CONT.

As described above, there is configured the operation time detection circuit which can detect the initialization time and the comparison operation time of the comparison circuit by comparing the voltage difference between the third reference voltage signal VREFM1 and the fourth reference voltage signal VREFM 2 which are taken out of the reference voltage generation circuit with a predetermined value. Therefore, the A/D converter can be operated with its optimum operation clock by controlling the delay amount of the variable delay circuit using the detected initialization time or comparison operation time of the comparison circuit in the A/D converter, thereby obtaining an A/D converter which can achieve high-speed operation, low power consumption, and high conversion precision.

(Configuration Example 3 of Operation Time Detection Circuit)

Figure 18:
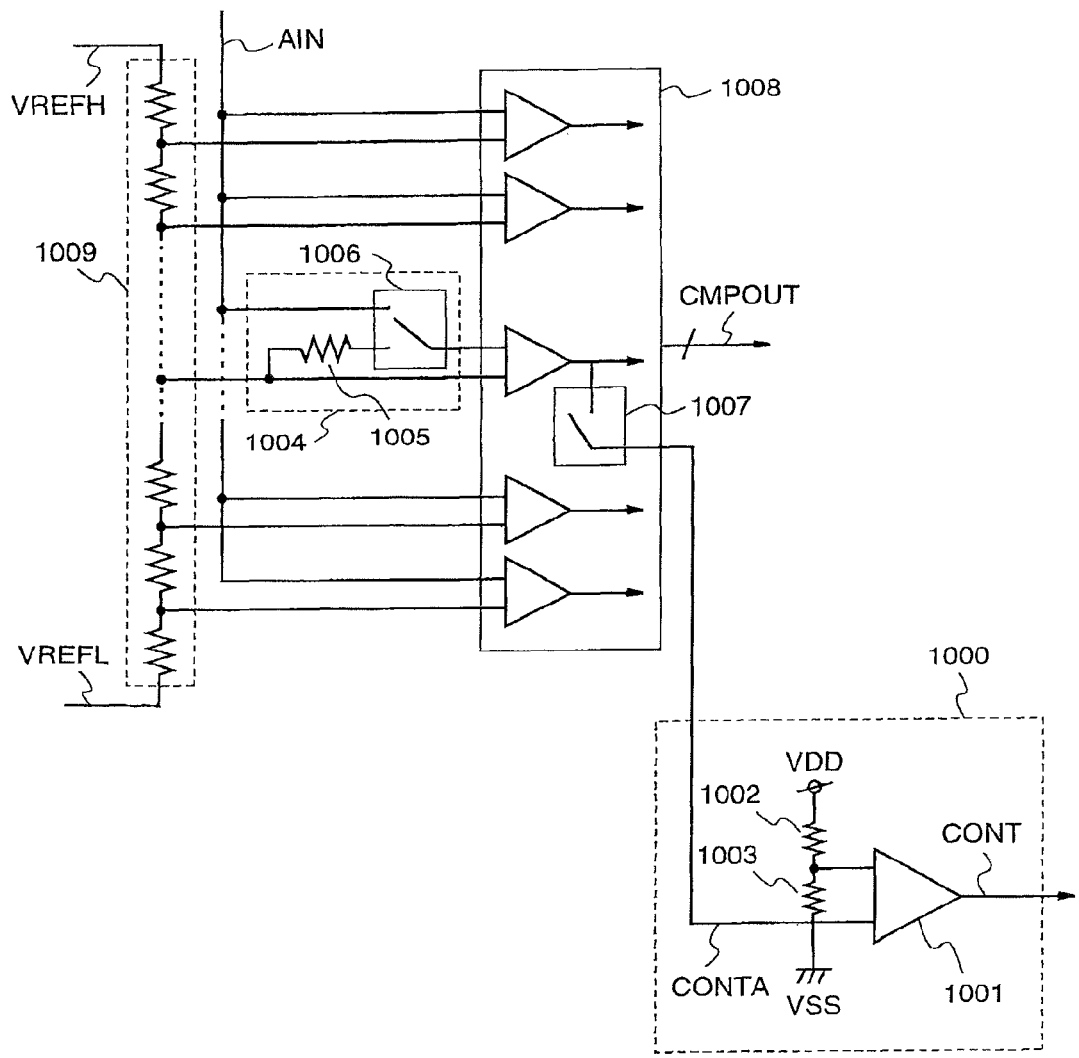
FIG. 18 is a diagram illustrating a configuration example of an operation time detection circuit 1000.

FIG. 18 shows a configuration example of an operation time detection circuit 1000 which can be used in the clock generator circuit 104 or 204 in the A/D converter of the first or second embodiment.

In FIG. 18, the A/D converter comprises a reference voltage generation circuit 1009, a comparison circuit 1008, the operation time detection circuit 1000, and an operation time detection support circuit 1004, and one of input signals to one circuit in the comparison circuit 1008 is connected to a node in the reference voltage generation circuit 1009 and to an end of a seventh resistor 1005, while the other input signal is connected to a second switch 1006 which can select either of the analog input signal AIN or the other end of the seventh resistor 1005.

An output signal from the one circuit in the comparison circuit 1008 is connected to a third switch 1007, and it is outputted as a detection signal CONTA when the third switch 1007 is ON to be connected to one input of a third comparator 1001, while the other input is connected to a node which is resistance-divided by fifth and sixth resistors 1002 and 1003 connected between the power supply voltage VDD and the ground voltage VSS, and an output of the third comparator 1001 becomes a control signal CONT.

When detecting the operation time, both the second switch and the third switch are turned on to make the third comparator compare the voltage change in the detection signal CONTA with "VDD/2" as described for the configuration shown in FIG. 16, whereby the initialization time and the comparison operation time of the comparison circuit can be detected, and thus the first comparator 901 can be deleted relative to the configuration shown in FIG. 12.

It is possible to make the A/D converter perform a normal A/D conversion operation by generating an optimum operation clock for the A/D converter with controlling the delay in the variable delay circuit 701 in the clock generator circuit 700 using this control signal CONT, and turning off the second switch and the third switch.

Figure 19:
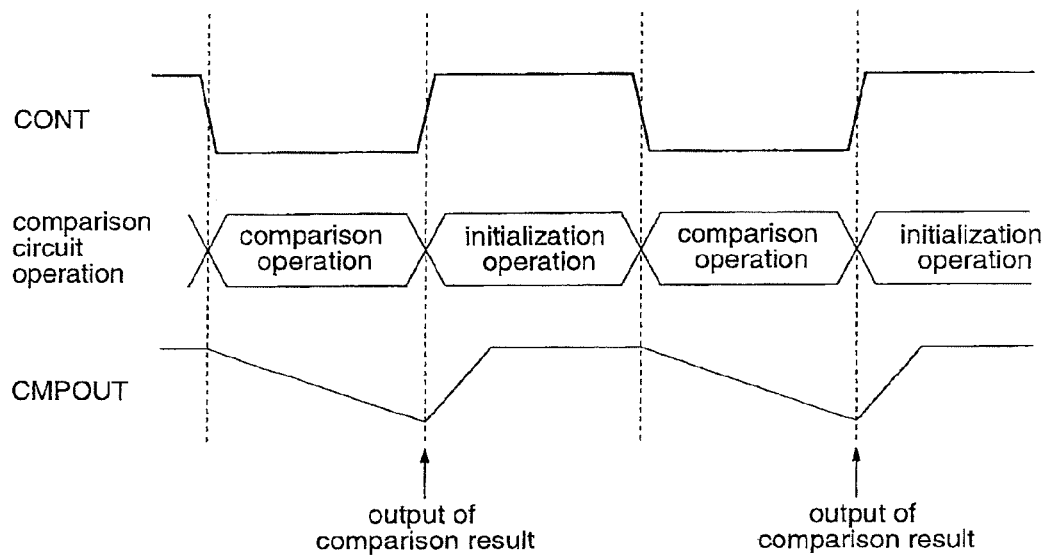
FIG. 19 is a first operation timing chart of the configurations shown in FIGS. 14, 16, and 18.

FIG. 19 shows a timing chart of the first operation of the configuration 800 shown in FIG. 14, the configuration 900 shown in FIG. 16, and the configuration 1000 shown in FIG. 18.

In FIG. 19, the control signal CONT is "LOW" during a period from when the comparison operation of the comparison circuit is started to when the comparison result output signal CMPOUT outputs the comparison operation result. An A/D converter operation clock which is most suitable for the comparison operation of the comparison circuit can be generated by controlling the delay amount of the variable delay circuit 701 in the clock generator circuit 700 with this control signal CONT.

Figure 20:
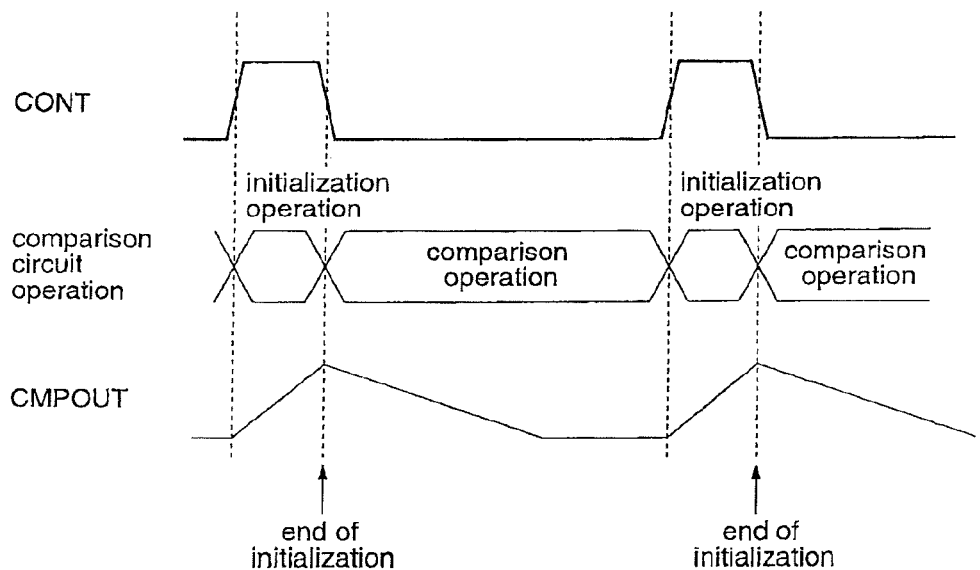
FIG. 20 is a second operation timing chart of the configurations shown in FIGS. 14, 16, and 18.

FIG. 20 shows the timing chart of the second operation of the configuration 800 shown in FIG. 14, or the configuration 900 shown in FIG. 16, or the configuration 1000 shown in FIG. 18.

In FIG. 20, the control signal CONT is "HIGH" during a period from when the initialization operation is started to when the comparison result output signal CMPOUT outputs the initialization result. An A/D converter operation clock which is most suitable for the initialization operation of the comparison circuit can be generated by controlling the delay amount of the variable delay circuit 701 in the clock generator circuit 700 with this control signal CONT.

Further, by setting the comparison operation time of the comparison circuit to "LOW" and the initialization operation time thereof to "HIGH" or by setting the comparison operation time of the comparison circuit to "HIGH" and the initialization operation time thereof to "LOW" in the configuration 800 of FIG. 14, or the configuration 900 of FIG. 16, or the configuration 1000 of FIG. 18, both the comparison operation and the initialization operation of the comparison circuit can be detected to generate A/D converter operation clocks which are most suitable for these operations.

As described above, there is configured the operation time detection circuit with a simple structure, which can detect the initialization time and the comparison operation time of the comparison circuit by comparing the voltage difference between the analog input signal with the reference voltage signal which is taken out of the reference voltage generation circuit. Therefore, the A/D converter can be operated with its optimum operation clock by controlling the delay amount of the variable delay circuit using the detected initialization time or comparison operation time of the comparison circuit in the A/D converter, thereby realizing an A/D converter which can achieve high-speed operation, low power consumption, and high conversion precision.

(Configuration Example 4 of Operation Time Detection Circuit)

Figure 21:
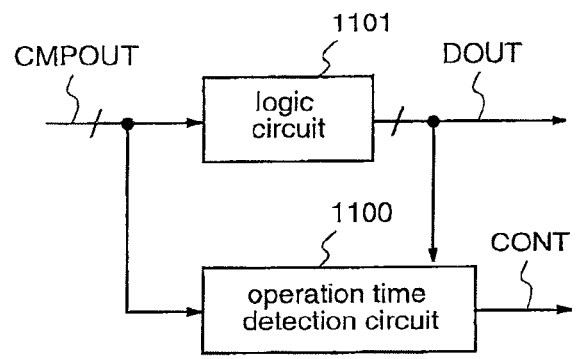
FIG. 21 is a diagram illustrating a configuration example of an operation time detection circuit 1100.

FIG. 21 shows a configuration example of an operation time detection circuit 1100 which can be used in the clock generator circuit 104 or 204 in the A/D converter of the first or second embodiment.

This operation time detection circuit 1100 is configured so as to receive, as input signals, the comparison result output signal CMPOUT from the comparison circuit (not shown) which corresponds to any of the comparison circuit 805 shown in FIG. 14, the comparison circuit 905 shown in FIG. 16, and the comparison circuit 1008 shown in FIG. 18, and a digital output signal DOUT from the logic circuit 1101 which receives the comparison result output signal CMPOUT.

In FIG. 21, the comparison result output signal CMPOUT is input to both of the logic circuit 1101 and the operation time detection circuit 1100, and the digital output signal DOUT of the logic circuit 1101 is externally outputted and simultaneously inputted to the operation time detection circuit 1100.

The operation time detection circuit 1100 can detect the initialization time and coding time of the logic circuit by comparing the comparison result output signal CMPOUT with the digital output signal DOUT. An optimum operation clock for the A/D converter can be generated by controlling the delay amount of the variable delay circuit 701 in the clock generator circuit 700 with the control signal CONT which is an output of the operation time detection circuit 1100.

Figure 22:
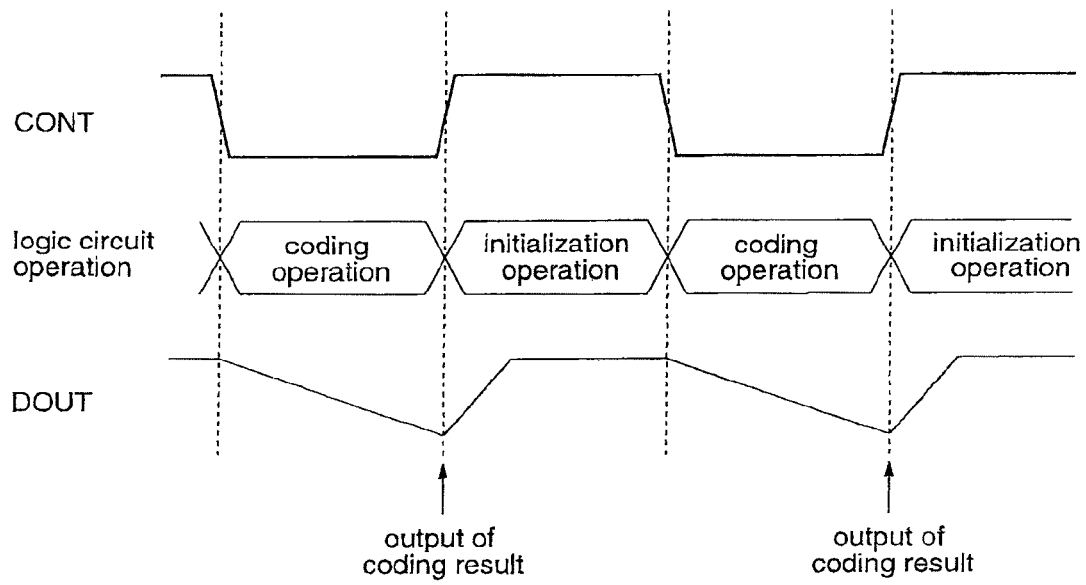
FIG. 22 is a first operation timing chart of the configuration shown in FIG. 21.

FIG. 22 shows a timing chart of the first operation of the configuration 1100 shown in FIG. 21.

In FIG. 22, the control signal CONT is "LOW" during a period from when the coding operation is started to when the digital output signal DOUT outputs the coding operation result. An A/D converter operation clock which is most suitable for the coding operation of the logic circuit can be generated by controlling the delay amount of the variable delay circuit 701 in the clock generator circuit 700 with this control signal CONT.

Figure 23:
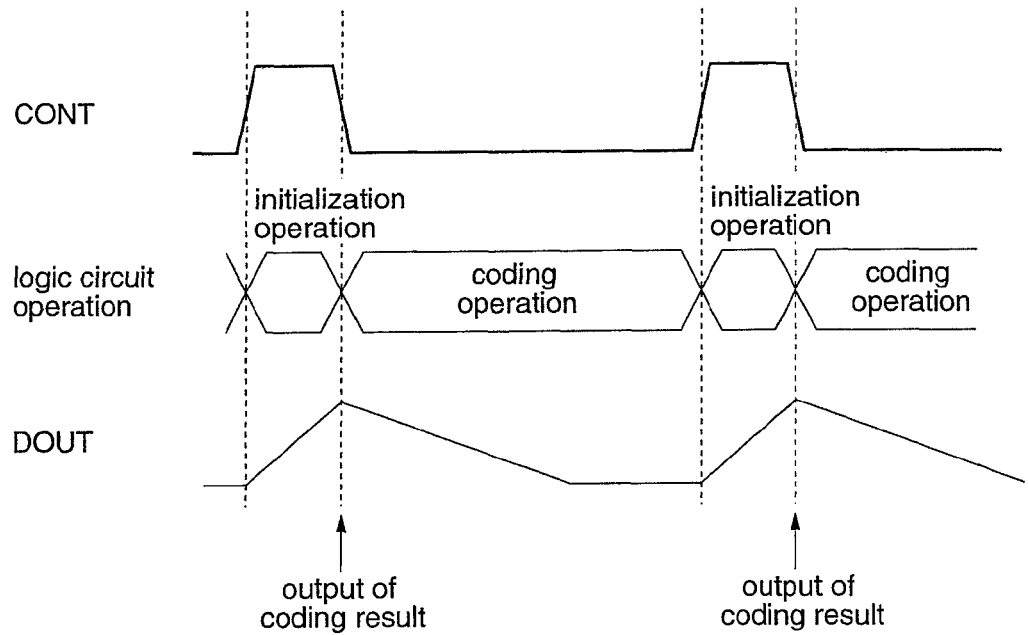
FIG. 23 is a second operation timing chart of the configuration shown in FIG. 21.
Figure 24:
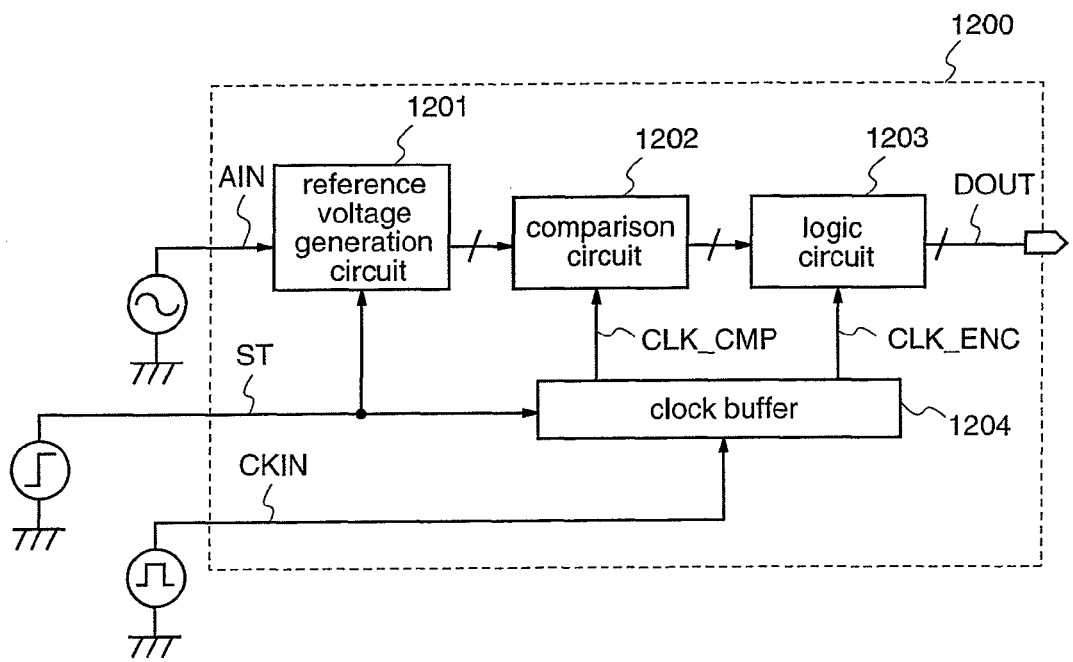
FIG. 24 is a diagram illustrating a conventional A/D converter 1200.
Figure 25:
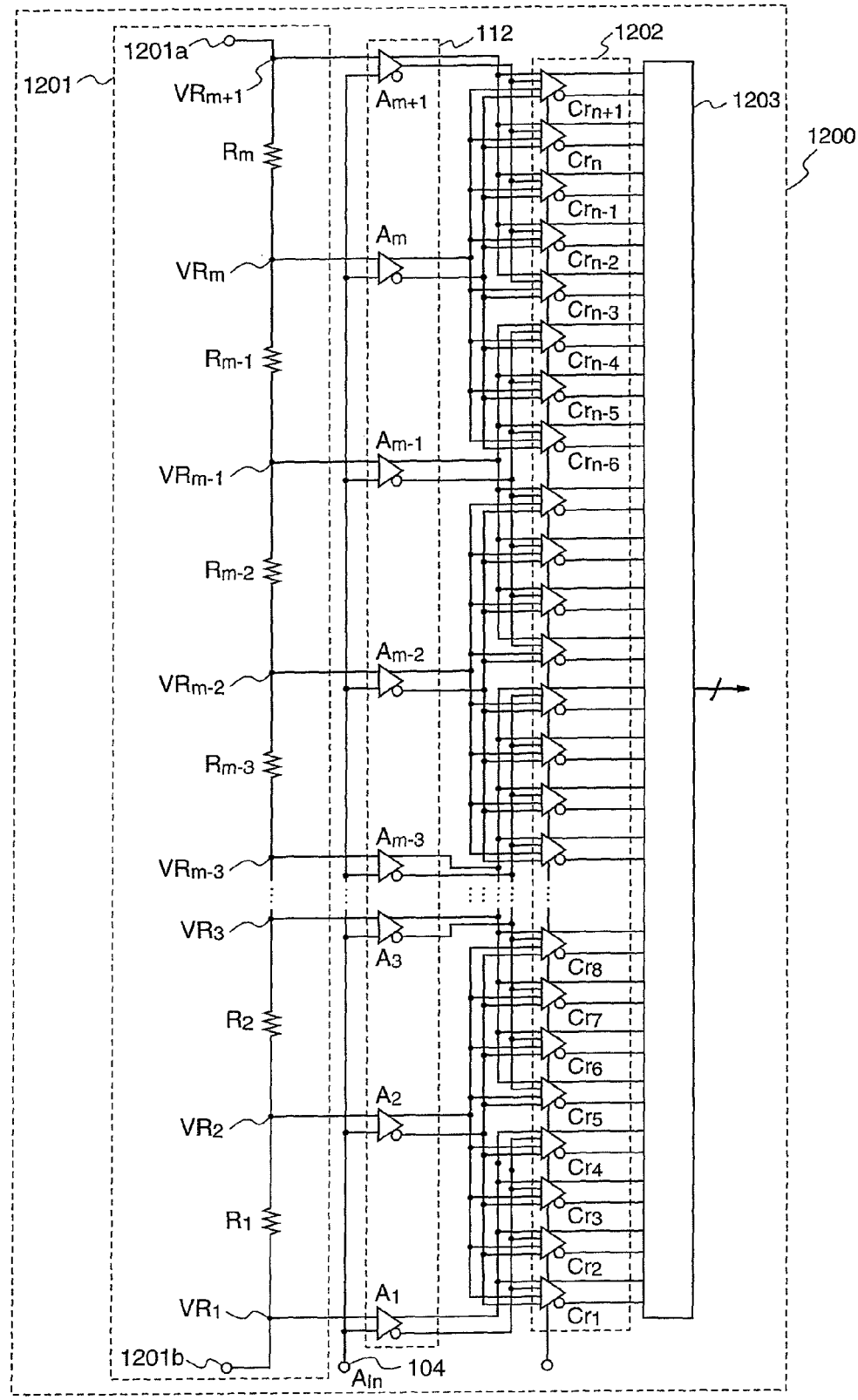
FIG. 25 is a diagram illustrating a configuration example of the conventional A/D converter 1200 which is disclosed in Patent Document 1.
Figure 26:
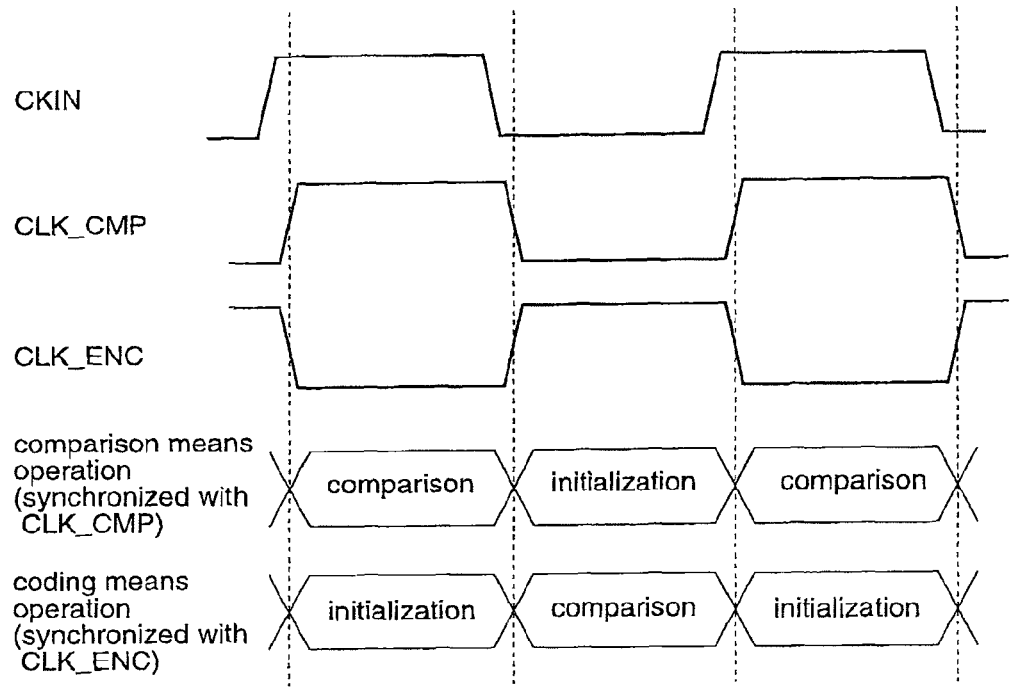
FIG. 26 is an operation timing chart of the configuration shown in FIG. 24.
Figure 27:
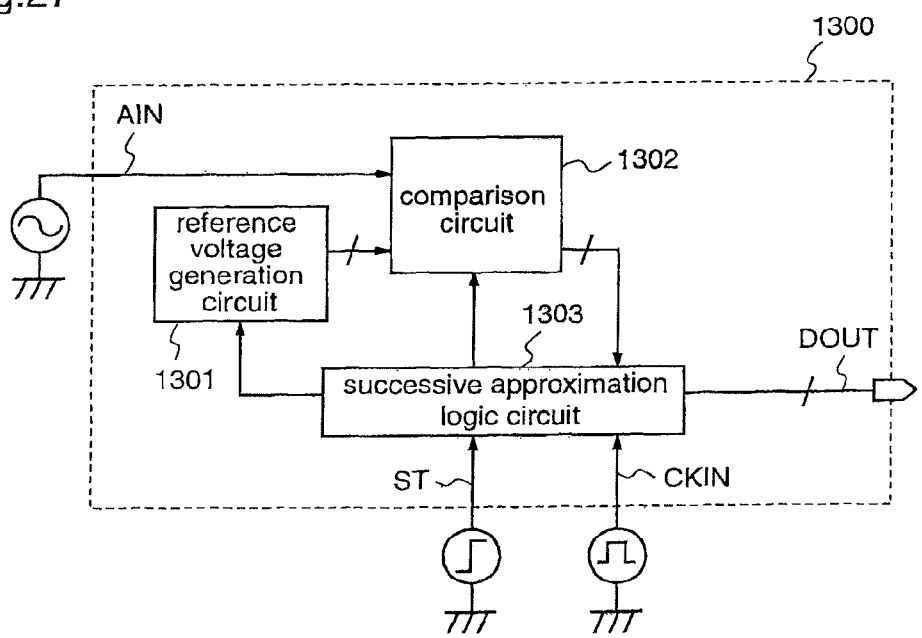
FIG. 27 is a diagram illustrating another conventional A/D converter 1300.
Figure 28:
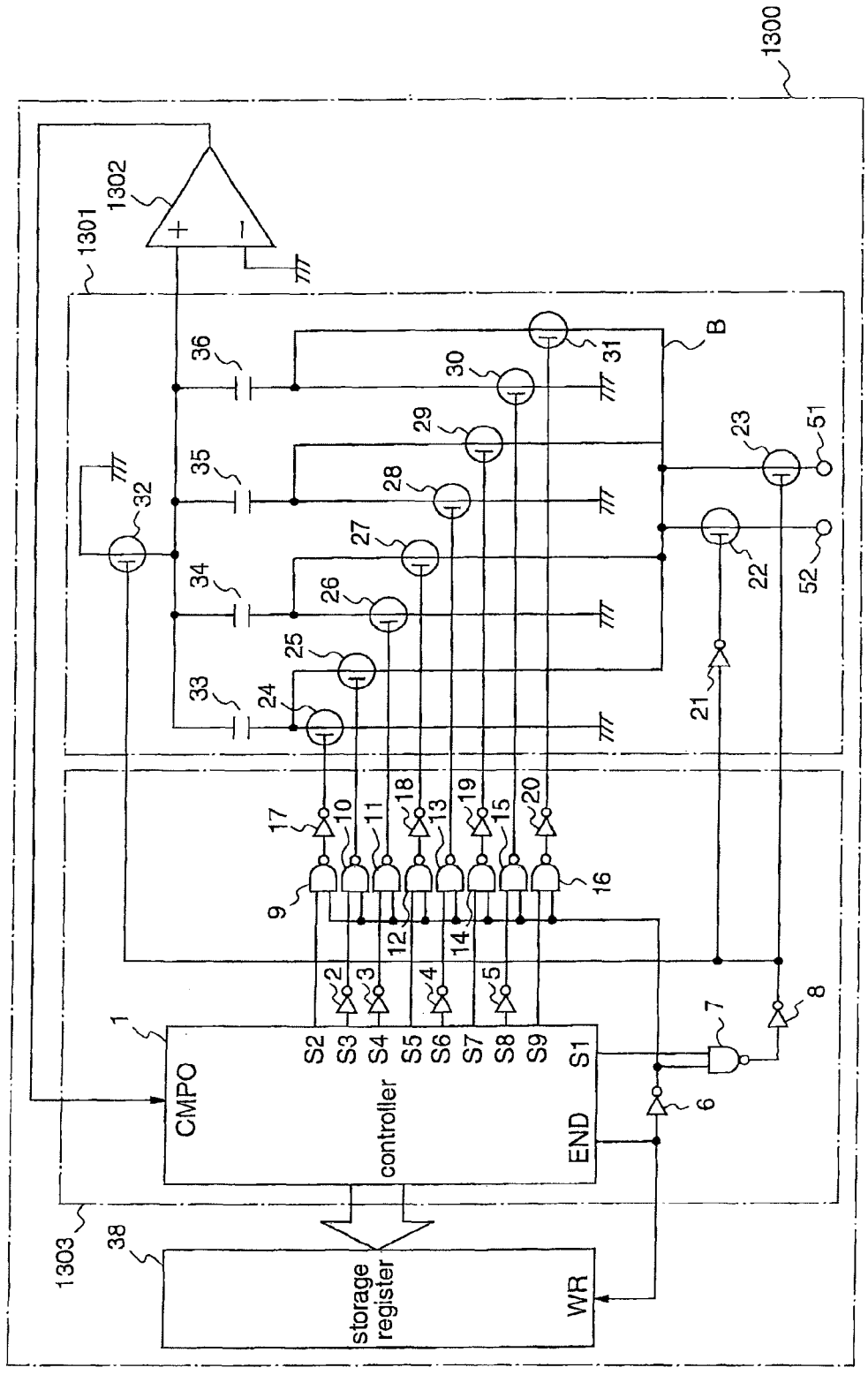
FIG. 28 is a diagram illustrating a configuration example of the conventional A/D converter 1300 which is disclosed in Patent Document 2.
Figure 29:
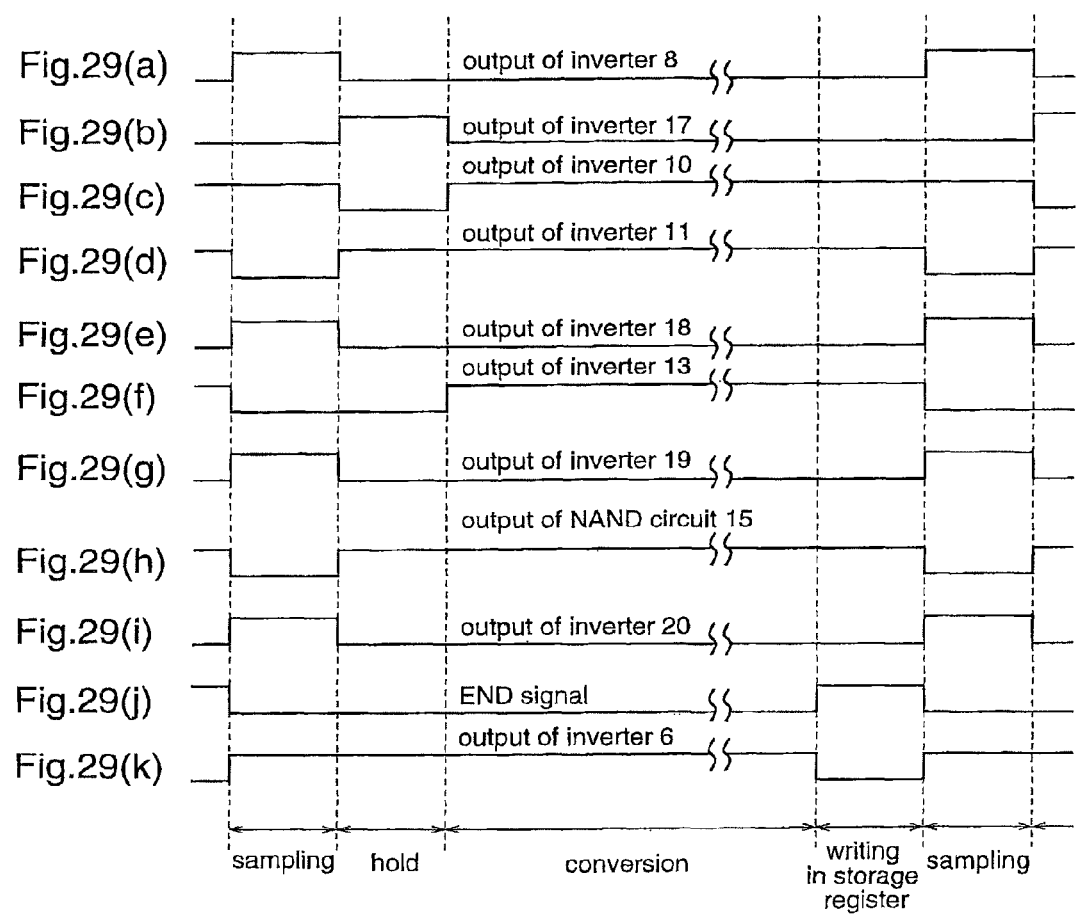
FIG. 29 is an operation timing chart of the configuration shown in FIG. 28.
Figure 30:
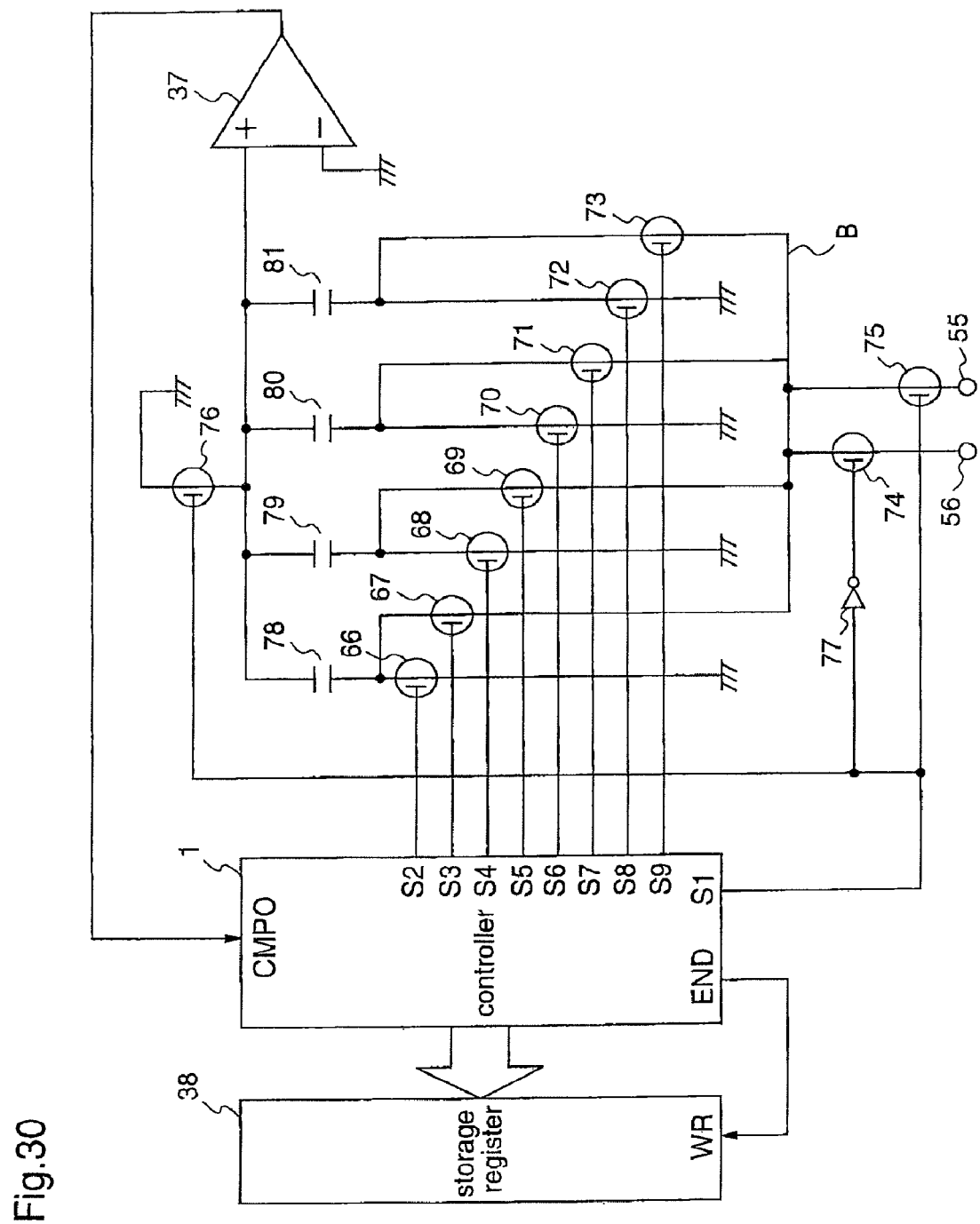
FIG. 30 is a diagram illustrating a configuration example of a conventional A/D converter (2) which is disclosed in Patent Document 2.

FIG. 23 shows a timing chart of the second operation of the configuration 1100 shown in FIG. 21.

In FIG. 23, the control signal CONT is "HIGH" during a period from when the initialization operation of the logic circuit is started to when the digital output signal DOUT outputs the initialization operation result. An A/D converter operation clock which is most suitable for the initialization operation of the logic circuit can be generated by controlling the delay amount of the variable delay circuit 701 in the clock generator circuit 700 with this control signal CONT.

Further, by setting the coding operation time of the logic circuit to "LOW" and the initialization operation time thereof to "HIGH" or by setting the coding operation time of the logic circuit to "HIGH" and the initialization operation time thereof to "LOW" in the configuration 1100 shown in FIG. 21, both the coding operation and the initialization operation of the logic circuit can be detected to generate A/D converter operation clocks which are most suitable for these operations.

Further, by setting the coding operation time of the logic circuit to "LOW" and the comparison operation time of the comparison circuit to "HIGH" or by setting the coding operation time of the logic circuit to "HIGH" and the comparison operation time of the comparison circuit to "LOW" in a configuration obtained by combining any of the configuration 800 of FIG. 14, the configuration 900 of FIG. 16, the configuration 1000 of FIG. 18, and the configuration 1100 of FIG. 21, both the coding operation of the logic circuit and the comparison operation of the comparison circuit can be detected to generate A/D converter operation clocks which are most suitable for these operations.

Further, likewise, by setting the initialization operation time of the logic circuit to "LOW" and the initialization operation time of the comparison circuit to "HIGH" or by setting the initialization operation time of the logic circuit to "HIGH" and the initialization operation time of the comparison circuit to "LOW" in a configuration obtained by combining any of the configuration of FIG. 14, the configuration 900 of FIG. 16, the configuration 1000 of FIG. 18, and the configuration 1100 of FIG. 21, both the initialization operation of the logic circuit and the initialization operation of the comparison circuit can be detected to generate operation clocks for the A/D converter which are most suitable for these operations.

Further, as shown in the timing chart of FIG. 7, the operation of each constituent of the A/D converter may be halted during an unnecessary time other than the necessary operation time of the constituent which is detected by the operation time detection circuit, and thereby low power consumption can be realized.

As described above, since the input signal to the logic circuit is input to the operation time detection circuit and the output signal from the logic circuit is also input to the operation time detection circuit, the operation time detection circuit can detect the initialization time and the coding time of the logic circuit, and thereby the A/D converter can be operated with its optimum operation clock by controlling the delay amount of the variable delay circuit using the detected initialization time of the logic circuit of the A/D converter, or the coding time thereof, or both of them, resulting in an A/D converter which can achieve high-speed operation, low power consumption, and high conversion precision.

Furthermore, by combining any of the configuration of FIG. 14, the configuration of FIG. 16, the configuration of FIG. 18, and the configuration of FIG. 21, both the coding operation of the logic circuit and the comparison operation of the comparison circuit can be detected to generate A/D converter operation clocks or the like which are most suitable for these operations, or both the initialization operation of the logic circuit and the initialization operation of the comparison circuit can be detected to generate A/D converter operation clocks or the like which are most suitable for these operations, and thereby the A/D converter can be operated with the optimum operation clocks.

While the first to fifth configuration examples of the clock generator circuit and the first to fourth configuration examples of the operation time detection circuit are those applicable to the A/D converter of the first or second embodiment, these circuits may be applied to the modification of the first embodiment or the modification of the second embodiment.

Since the A/D converter of the present invention requires no external input operation clock signal as described above, it is effective in realizing reductions in space and cost for generating an external input operation clock signal.

Further, since an optimum operation clock signal can be generated inside the A/D converter to realize high-speed operation without deteriorating the conversion precision, it is useful as an A/D converter to be used in a system for oversampling or a system capable of nonsynchronous operation.

The invention claimed is:
1. An A/D converter comprising:
a reference voltage generation circuit for generating a reference voltage which is a comparison target when converting an analog input signal into a digital output signal;
a comparison circuit for comparing the analog input signal with the reference voltage;

a logic circuit for outputting a digital output signal corresponding to the analog input signal on the basis of the output result of the comparison circuit; and a clock generator circuit for generating operation clock signals to be supplied to the comparison circuit and the logic circuit using, as a trigger, a start signal which starts the A/D converter to operate; wherein said clock generator circuit has a delay circuit for delaying the start signal, and generates the operation clock signals by feedbacking an output signal from the delay circuit.

2. An A/D converter as defined in claim 1 wherein said clock generator circuit further includes a phase comparator which compares the phase of the input signal to the delay circuit with the phase of the output signal from the delay circuit, and supplies its output to the delay circuit as a control signal for controlling the delay amount of the delay circuit.

3. An A/D converter as defined in claim 2 wherein the delay time of the delay circuit in the clock generator circuit is variable.

4. An A/D converter as defined in claim 1 wherein the delay time of the delay circuit in the clock generator circuit is variable.

5. An A/D converter as defined in claim 1 wherein said start signal is a rising edge of a power supply which is supplied to any of the circuits which are the constituents of the A/D converter.

6. An A/D converter comprising:

a reference voltage generation circuit for generating a reference voltage which is a comparison target when converting an analog input signal into a digital output signal;

a comparison circuit for comparing the analog input signal with the reference voltage;

a logic circuit for outputting a digital output signal corresponding to the analog input signal on the basis of the output result of the comparison circuit; and a clock generator circuit for generating operation clock signals to be supplied to the comparison circuit and the logic circuit using, as a trigger, a start signal which starts the A/D converter to operate; wherein said clock generator circuit includes an operation time detection circuit for detecting an operation time of any circuit among the reference voltage generation circuit, the comparison circuit, and the logic circuit which are the constituents of the A/D converter, and generates the operation clock signal according to the detected operation time.

7. An A/D converter as defined in claim 6 wherein the operation time of said any circuit for which the operation time is detected is a comparison operation time of the comparison circuit, and the operation clock is generated according to the detected comparison operation time.

8. An A/D converter as defined in claim 6 wherein the operation time of said any circuit for which the operation time is detected is an initialization time of the comparison circuit, and the operation clock is generated according to the detected initialization time.

9. An A/D converter as defined in claim 6 wherein the operation time of said any circuit for which the operation time is detected is a coding time of the logic circuit, and the operation clock is generated according to the detected coding time.

10. An A/D converter as defined in claim 6 wherein the operation time of said any circuit for which the operation time is detected is an initialization time of the logic circuit, and the operation clock is generated according to the detected initialization time.

11. An A/D converter as defined in claim 6 wherein the operation time of said any circuit for which the operation time is detected is a sum of a comparison operation time and an initialization time of the comparison circuit, and the operation clock is generated according to the time of the detected sum.

12. An A/D converter as defined in claim 6 wherein the operation time of said any circuit for which the operation time is detected is a sum of a coding time and an initialization time of the logic circuit, and the operation clock is generated according to the time of the detected sum.

13. An A/D converter as defined in claim 6 wherein the operation time of said any circuit for which the operation time is detected is a sum of a comparison time of the comparison circuit and a coding time of the logic circuit, and the operation clock is generated according to the time of the detected sum.

14. An A/D converter as defined in claim 6 wherein the operation time of said any circuit for which the operation time is detected is a sum of an initialization time of the comparison circuit and an initialization time of the logic circuit, and the operation clock is generated according to the time of the detected sum.

15. An A/D converter as defined in claim 6 wherein said clock generator circuit halts the operation of said any circuit for which the operation time is detected among the reference voltage generation circuit, the comparison circuit, and the logic circuit, during a time other than the operation time detected by the operation time detection circuit.

* * * * *